(12) United States Patent
Muroga

(10) Patent No.: US 11,823,993 B2
(45) Date of Patent: Nov. 21, 2023

(54) WIRING SUBSTRATE AND SEMICONDUCTOR DEVICE EACH HAVING FIRST AND SECOND VIA WIRINGS

(71) Applicant: SHINKO ELECTRIC INDUSTRIES CO., LTD., Nagano (JP)

(72) Inventor: Masataka Muroga, Nagano (JP)

(73) Assignee: SHINKO ELECTRIC INDUSTRIES CO., LTD, Nagano-ken (JP)

( * ) Notice: Subject to any disclaimer, the term of this patent is extended or adjusted under 35 U.S.C. 154(b) by 123 days.

(21) Appl. No.: 17/508,944

(22) Filed: Oct. 22, 2021

(65) Prior Publication Data

US 2022/0130746 A1     Apr. 28, 2022

(30) Foreign Application Priority Data

Oct. 28, 2020   (JP) ................................. 2020-180654

(51) Int. Cl.
*H01L 23/498*     (2006.01)
(52) U.S. Cl.
CPC .. *H01L 23/49838* (2013.01); *H01L 23/49822* (2013.01); *H01L 23/49866* (2013.01)
(58) Field of Classification Search
CPC ......... H01L 23/49838; H01L 23/49822; H01L 23/49866
See application file for complete search history.

(56) References Cited

U.S. PATENT DOCUMENTS

| 2010/0132998 | A1 | 6/2010 | Lee et al. |
| 2016/0381796 | A1* | 12/2016 | Lee ......................... H05K 3/067 |
| | | | 174/262 |
| 2019/0371621 | A1* | 12/2019 | Darmawikarta .. H01L 23/49822 |
| 2020/0168536 | A1* | 5/2020 | Link ..................... H01L 23/645 |

FOREIGN PATENT DOCUMENTS

JP      2010-129996 A     6/2010

* cited by examiner

*Primary Examiner* — Michael Jung
(74) *Attorney, Agent, or Firm* — TAROLLI, SUNDHEIM, COVELL & TUMMINO L.L.P.

(57) ABSTRACT

A wiring substrate includes a first insulation layer, a first through hole extending through the first insulation layer in a thickness-wise direction, a first via wiring formed in the first through hole, a second insulation layer formed on an upper surface of the first insulation layer, a first recess formed in a lower surface of the second insulation layer and connected to the first through hole, an opening formed in an upper surface of the second insulation layer and connected to the first recess, a second recess formed in an upper surface of the first via wiring and connected to the first recess, a second via wiring formed in the opening, the first recess, and the second recess, and a first wiring pattern formed on the upper surface of the second insulation layer and electrically connected to the first via wiring by the second via wiring.

10 Claims, 13 Drawing Sheets

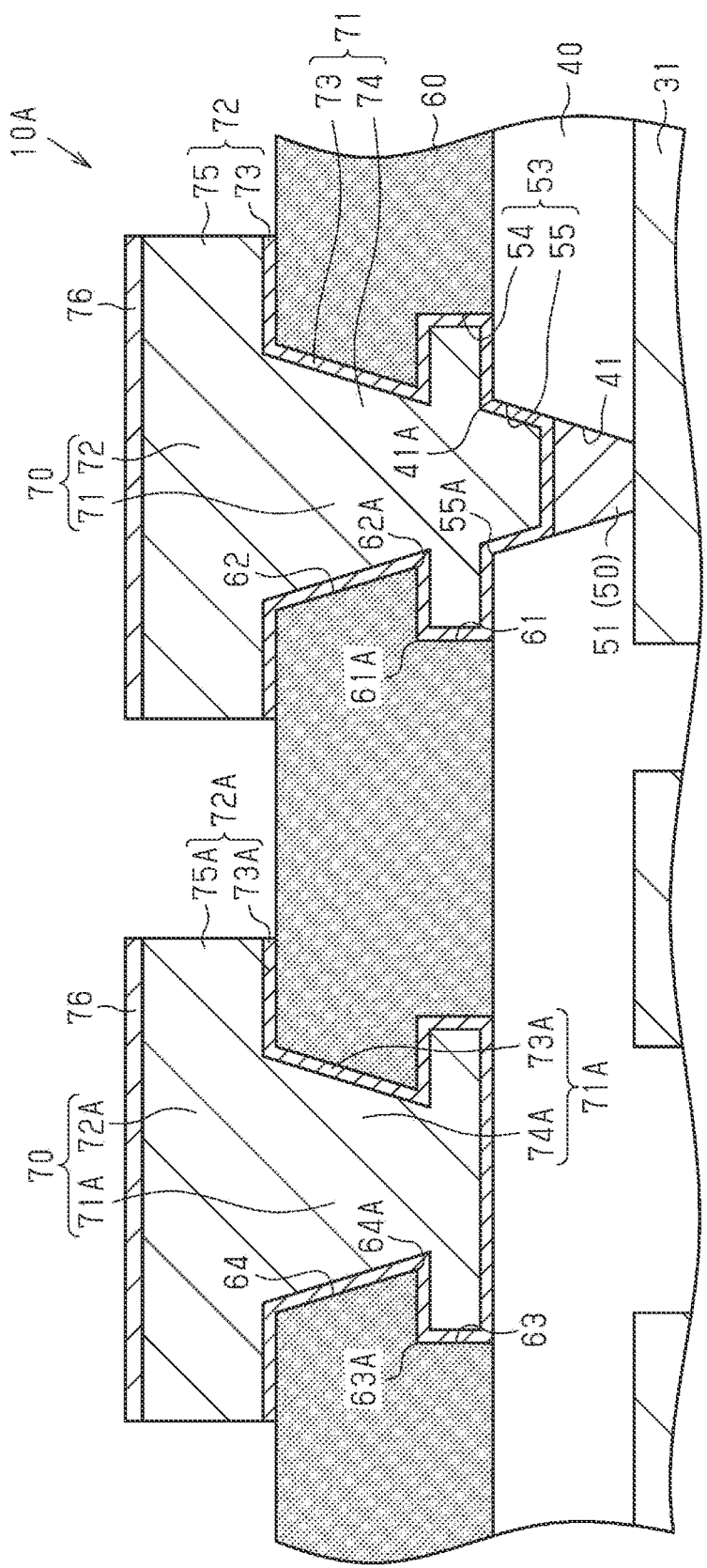

US 11,823,993 B2

WIRING SUBSTRATE AND SEMICONDUCTOR DEVICE EACH HAVING FIRST AND SECOND VIA WIRINGS

CROSS-REFERENCE TO RELATED APPLICATIONS

This application is based upon and claims the benefit of priority from prior Japanese Patent Application No. 2020-180654, filed on Oct. 28, 2020, the entire contents of which are incorporated herein by reference.

FIELD

The present disclosure is related to a wiring substrate, a semiconductor device, and a method for manufacturing a wiring substrate.

BACKGROUND

Wiring substrates on which electronic components such as semiconductor elements are mounted have various shapes and various structures. As recent semiconductor elements are highly integrated and highly sophisticated, there is an increasing demand that wiring substrates on which semiconductor elements are mounted have finer wiring. Japanese Laid-Open Patent Publication No. 2010-129996 discloses an example of a wiring substrate. In the wiring substrate, a wiring layer and a solder resist layer are formed on a base substrate so that the solder resist layer covers the wiring layer. The solder resist layer has an opening that exposes the wiring layer. A rod-shaped connection terminal is formed on the exposed wiring layer. In this type of wiring substrate, the opening in the solder resist layer is filled with a via wiring. The lower surface of the via wiring is connected to the upper surface of the wiring layer.

SUMMARY

When, for example, a semiconductor element is mounted on the wiring substrate, a large amount of stress may be applied to the vicinity of the interface between the via wiring and the wiring layer. When the width of the lower surface of the via wiring is decreased as a result of finer wiring, the area of contact of the lower surface of the via wiring with the upper surface of the wiring layer is decreased. This facilitates formation of cracks and the like in the interface between the via wiring and the wiring layer when stress is applied to the vicinity of the interface between the via wiring and the wiring layer.

An embodiment of a wiring substrate includes a first insulation layer, a first through hole extending through the first insulation layer in a thickness-wise direction, a first via wiring formed in the first through hole, a second insulation layer formed on an upper surface of the first insulation layer, a first recess formed in a lower surface of the second insulation layer and connected to the first through hole, an opening formed in an upper surface of the second insulation layer and connected to the first recess, a second recess formed in an upper surface of the first via wiring and connected to the first recess, a second via wiring formed in the opening, the first recess, and the second recess, and a first wiring pattern formed on the upper surface of the second insulation layer and electrically connected to the first via wiring by the second via wiring.

BRIEF DESCRIPTION OF THE DRAWINGS

The embodiments, together with objects and advantages thereof, may best be understood by reference to the following description of the presently preferred embodiments together with the accompanying drawings in which:

FIG. 10 is a schematic enlarged partial cross-sectional view illustrating another modified example of a wiring substrate.

DESCRIPTION OF THE EMBODIMENTS

Figure 1A:
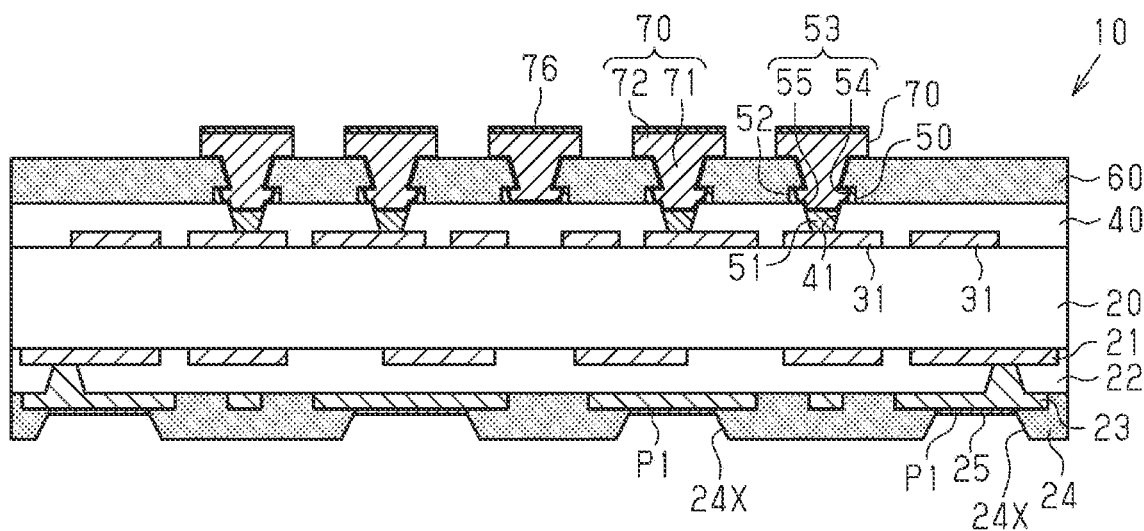
FIG. 1A is a schematic cross-sectional view illustrating an embodiment of a wiring substrate.

An embodiment will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings.

In this specification, "plan view" refers to a view of a subject taken in a vertical direction (for example, upper-lower direction in FIG. 1A), and "planar shape" refers to a shape of a subject taken in the vertical direction. In this specification, the frame of reference for "the upper-lower direction" and "the sideward direction" is each drawing positioned so that the reference characters are properly read. The terms "parallel" and "orthogonal" in this specification are not limited to exactly parallel and exactly orthogonal and intend to include generally parallel and generally orthogonal within the scope in which the operation and advantages of each embodiment are obtained.

The structure of a wiring substrate 10 will now be described.

As illustrated in FIG. 1A, the wiring substrate 10 includes a substrate body 20 located near the center in a thickness-wise direction of the wiring substrate 10. A wiring layer 21, an insulation layer 22, a wiring layer 23, and a solder resist layer 24 are sequentially stacked on the lower surface of the substrate body 20. A wiring layer 31, an insulation layer 40, a wiring layer 50, a solder resist layer 60, and a wiring layer 70 are sequentially stacked on the upper surface of the substrate body 20. The insulation layer 40 is an example of a first insulation layer. The solder resist layer 60 is an example of a second insulation layer.

The substrate body 20 may be, for example, a core substrate, a build-up core substrate that includes a core substrate, or a coreless substrate that does not include a core substrate.

The material of the wiring layers 21, 23, 31, 50, and 70 may be, for example, copper (Cu) or a copper alloy. The material of the insulation layers 22 and 40 may be, for example, an insulative resin such as epoxy resin or a polyimide resin, or a resin material obtained by mixing an insulative resin with a filler such as silica or alumina.

The wiring layer 21 is formed on the lower surface of the substrate body 20. The insulation layer 22 is formed on the lower surface of the substrate body 20 to cover the wiring layer 21. The wiring layer 23 is formed on the lower surface of the insulation layer 22. The wiring layer 23 includes a via wiring and a wiring pattern. The via wiring extends through the insulation layer 22 in the thickness-wise direction. The wiring pattern is formed on the lower surface of the insulation layer 22 and is electrically connected to the wiring layer 21 by the via wiring.

The solder resist layer 24 is formed on the lower surface of the insulation layer 22 to cover the wiring layer 23. The material of the solder resist layer 24 may be, for example, an insulative resin including a photosensitive resin such as a phenol resin or an epoxy resin as a main component. The solder resist layer 24 may include, for example, a filler such as silica or alumina. The material of the solder resist layer 24 is not limited to an insulative resin that includes a photosensitive resin as a main component and may be, for example, the same insulative resin as that of the insulation layer 22. The solder resist layer 24 includes openings 24X exposing portions of the lower surface of the wiring layer 23 as external connection pads P1. When the wiring substrate 10 is mounted on a mount substrate such as a motherboard, external connection terminals 86 (refer to FIG. 2) such as solder balls or lead pins are connected to the external connection pads P1.

When appropriate, a surface-processed layer 25 is formed on the lower surface of the wiring layer 23 exposed in the bottom of each opening 24X. Examples of the surface-processed layer 25 include a gold (Au) layer, a nickel (Ni) layer/Au layer (a metal layer in which the Ni layer is used as the bottom layer, and the Au layer is formed on the Ni layer), and a Ni layer/palladium (Pd) layer/Au layer (a metal layer in which the Ni layer is used as the bottom layer, and the Ni layer, the Pd layer, and the Au layer are sequentially stacked). The Au layer is a metal layer formed from Au or an Au alloy. The Ni layer is a metal layer formed from Ni or a Ni alloy. The Pd layer is a metal layer formed from Pd or a Pd alloy. Each of the Ni layer, the Au layer, and the Pd layer may be, for example, an electroless plated metal layer formed through an electroless plating process. In another example of the surface-processed layer 25, an organic solderability preservative (OSP) film may be formed on the surface of the external connection pads P1 through an anti-oxidation process such as an OSP process. The OSP film may be a coating of an organic compound such as an azole compound or an imidazole compound. When the surface-processed layer 25 is formed on the lower surface of the wiring layer 23, the surface-processed layer 25 is used as the external connection pads P1.

Figure 2:
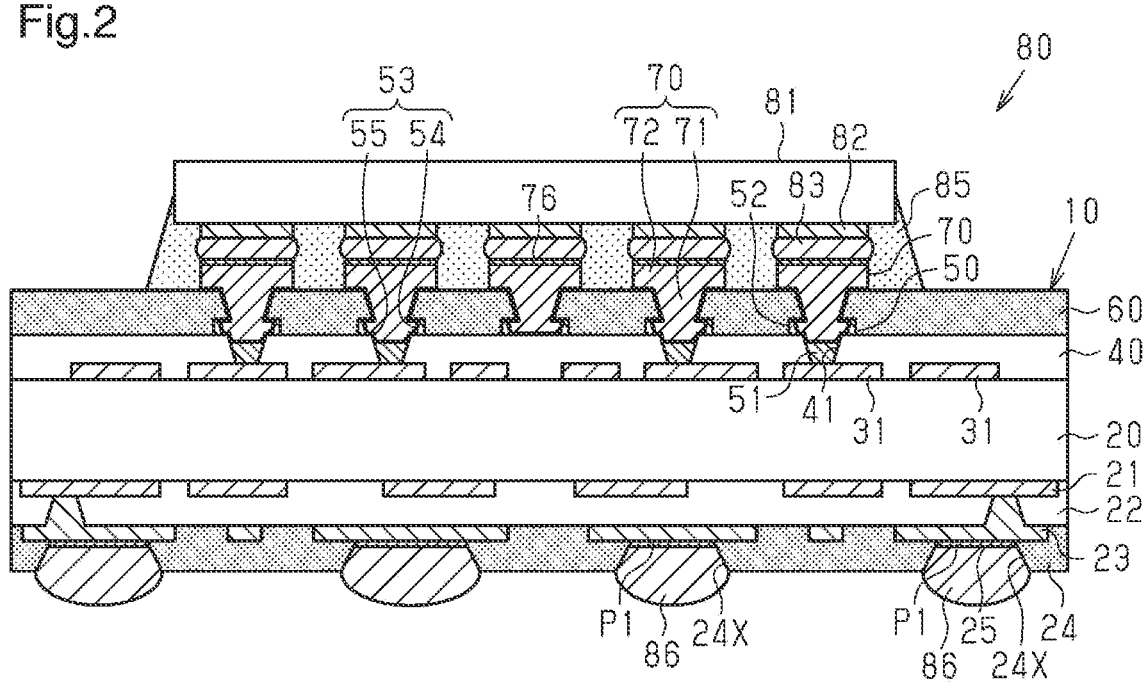
FIG. 2 is a schematic cross-sectional view illustrating a semiconductor device including the wiring substrate illustrated in FIG. 1A.

In the example illustrated in FIG. 2, the external connection terminals 86 are formed on the surface-processed layer 25. Alternatively, the wiring layer 23 exposed in the bottom of each opening 24X (or the surface-processed layer 25 formed on the wiring layer 23) may be used as external connection terminals.

The wiring layer 31 is formed on the upper surface of the substrate body 20. Although not illustrated, the wiring layer 31 is electrically connected to the wiring layer 21 by, for example, a wiring layer and/or a through electrode formed in the substrate body 20.

The insulation layer 40 is formed on the upper surface of the substrate body 20 to cover the wiring layer 31. The thickness of the insulation layer 40 from the upper surface of the wiring layer 31 to the upper surface of the insulation layer 40 may be, for example, approximately 10 μm to 30 μm.

Figure 1B:
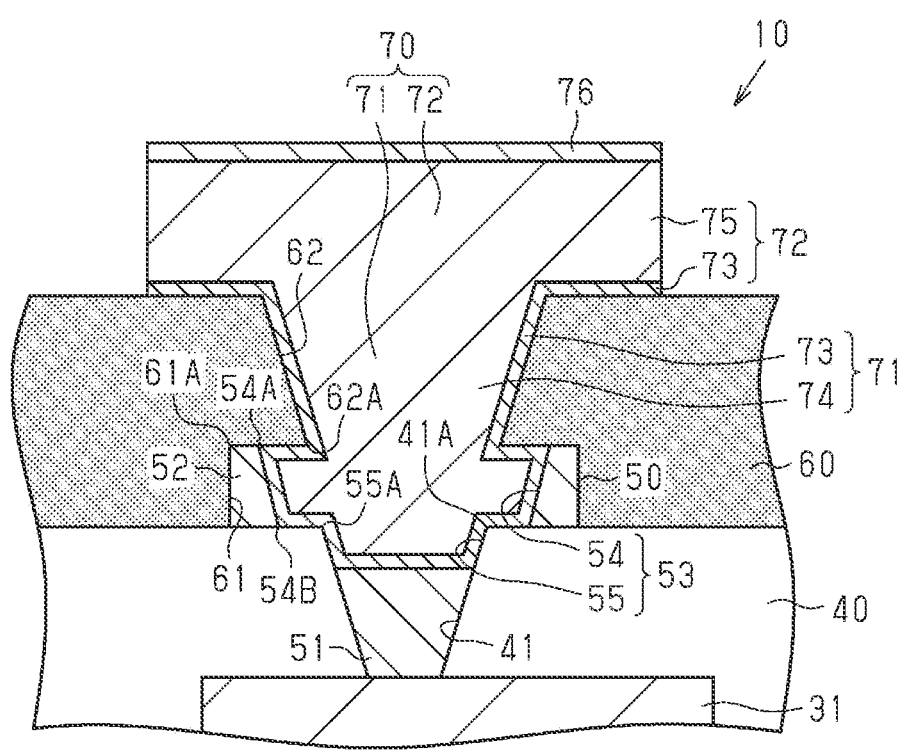
FIG. 1B is an enlarged partial cross-sectional view of the wiring substrate illustrated in FIG. 1A.

As illustrated in FIG. 1B, the insulation layer 40 includes through holes 41 extending through the insulation layer 40 in the thickness-wise direction to expose portions of the upper surface of the wiring layer 31. Each through hole 41 is an example of a first through hole. The through hole 41 may have any planar shape and any size. The planar shape of the through hole 41 may, for example, circular. The depth of the through hole 41 may be, for example, approximately 10 μm to 30 μm. The through hole 41 is, for example, tapered so that the opening width (diameter) of the through hole 41 is decreased from the upper side (the upper surface of the insulation layer 40) toward the lower side in FIG. 1B.

For example, in plan view, the wall surface of the through hole 41 is inclined toward the center of the through hole 41 as the wall surface extends from the upper surface of the insulation layer 40 toward the upper surface of the wiring layer 31. The wall surface of the through hole 41 does not necessarily have to be flat. The wall surface of the through hole 41 may partially or entirely have an outward curve or an inward curve. In the example illustrated in FIG. 1B, in a cross-sectional view, the wall surface of the through hole 41 has an inclined flat surface linearly extending without steps. The wall surface of the through hole 41 may be inclined at a fixed angle.

The wiring layer 50 is formed on the upper surface of the insulation layer 40. For example, the wiring layer 50 includes a via wiring 51 formed in the through hole 41 and a wiring pattern 52 formed on the upper surface of the insulation layer 40. The via wiring 51 is an example of a first via wiring. The wiring pattern 52 is an example of a second wiring pattern. The wiring pattern 52 is electrically connected to the wiring layer 31 by a via wiring portion that includes the via wiring 51. The wiring layer 50 has a hole 53 extending from the upper surface of the wiring pattern 52 to an intermediate position of the via wiring 51 in the thickness-wise direction. In the example illustrated in FIG. 1B, the hole 53 includes a through hole 54 extending through the wiring pattern 52 in the thickness-wise direction and a recess 55 connected to the through hole 54 and exposing the upper surface of the via wiring 51. The through hole 54 is an example of a second through hole. The recess 55 is an example of a second recess. The thickness of the wiring pattern 52 may be, for example, approximately 5 μm to 20 μm. The thickness of the via wiring 51 may be, for example, approximately 10 μm to 30 μm.

The solder resist layer 60 is formed on the upper surface of the insulation layer 40. The solder resist layer 60 covers the wiring layer 50. The solder resist layer 60 is, for example, the outermost insulation layer (in this example, uppermost insulation layer) of the wiring substrate 10. The solder resist layer 60 and the insulation layer 40 have, for example, different thermal expansion coefficients. The material of the solder resist layer 60 may be an insulative resin having a thermal expansion coefficient that differs from the thermal expansion coefficient of the insulative resin used as the material of the insulation layer 40. For example, an insulative resin including a photosensitive resin such as a phenol resin or an epoxy resin as a main component may be used as the material of the solder resist layer 60. The solder resist layer 60 may include, for example, a filler such as silica or alumina. The material of the solder resist layer 60 is not limited to an insulative resin including a photosensitive resin as a main component and may be, for example, an insulative resin including a non-photosensitive resin such as a thermosetting resin. The thickness of the solder resist layer 60 from the upper surface of the wiring pattern 52 to the upper surface of the solder resist layer 60 may be, for example, approximately 10 μm to 30 μm.

As illustrated in FIG. 1B, a recess 61 is formed in the lower surface of the solder resist layer 60. The recess 61 is an example of a first recess. The recess 61 is recessed from the lower surface of the solder resist layer 60 toward the upper surface of the solder resist layer 60. The recess 61 is connected to the through hole 41. The recess 61 is, for example, located directly above the through hole 41. The wall surface of the recess 61 is formed by the solder resist layer 60. The wiring pattern 52 is formed in the recess 61. The wiring pattern 52 covers, for example, the wall surface of the recess 61.

The solder resist layer 60 includes an opening 62 that extends through the solder resist layer 60 in the thickness-wise direction and is connected to the recess 61. The opening 62 is, for example, located directly above the recess 61. For example, the opening 62 is arranged to overlap the through hole 41 and the recess 61 in plan view. The opening 62 may have any planar shape and any size. The planar shape of the opening 62 may be, for example, circular. The depth of the opening 62 may be, for example, approximately 10 μm to 30 μm. The opening 62 is, for example, tapered so that the opening width (diameter) of the opening 62 is decreased from the upper side (the upper surface of the solder resist layer 60) toward the lower side in FIG. 1B.

For example, in plan view, the wall surface of the opening 62 is inclined toward the center of the opening 62 as the wall surface extends from the upper surface of the solder resist layer 60 toward the recess 61. The wall surface of the opening 62 does not necessarily have to be flat. The wall surface of the opening 62 may partially or entirely have an outward curve or an inward curve. In the example illustrated in FIG. 1B, in a cross-sectional view, the wall surface of the opening 62 has an inclined flat surface linearly extending without steps. The wall surface of the opening 62 may be inclined at a fixed angle.

The structures of the recess 61, the hole 53, and the opening 62 and their peripheral structures will now be described in detail.

The recess 61 is connected to the opening 62. The recess 61 has a larger opening width than the opening 62. For example, the recess 61 includes an upper open end 61A (i.e., upper end) and a lower open end 62A (i.e., lower end). The upper open end 61A has a larger opening width than the lower open end 62A. The wall surface of the recess 61 extends, for example, perpendicular to the upper surface of the insulation layer 40 in a cross-sectional view. The wiring pattern 52 is in contact with the wall surface of the recess 61 and covers the wall surface of the recess 61. Thus, the side surface of the wiring pattern 52 extends, for example, perpendicular to the upper surface of the insulation layer 40 in the cross-sectional view. The wall surface of the recess 61 and the side surface of the wiring pattern 52 are not limited to a perpendicular flat surface and may be a curved surface or a tapered surface.

The through hole 54 extends through the wiring pattern 52 in the thickness-wise direction. The through hole 54 is connected to both the opening 62 and the through hole 41. The through hole 54 may have any planar shape and any size. The planar shape of the through hole 54 may be, for example, the same as the planar shape of the opening 62. The planar shape of the through hole 54 may, for example, circular. The depth of the through hole 54 may be, for example, approximately 5 μm to 20 μm. The through hole 54 is, for example, tapered so that the opening width (diameter) of the through hole 54 is decreased from the upper side (the upper surface of the wiring layer 50) toward the lower side in FIG. 1B.

For example, in plan view, the wall surface of the through hole 54 is inclined toward the center of the opening 62 as the wall surface extends from the opening 62 (the upper surface of the wiring pattern 52) toward the recess 55 (the lower surface of the wiring pattern 52). The wall surface of the through hole 54 does not necessarily have to be flat. The wall surface of the through hole 54 may partially or entirely have an outward curve or an inward curve. In the example illustrated in FIG. 1B, in a cross-sectional view, the wall surface of the through hole 54 has an inclined flat surface linearly extending without steps. The wall surface of the through hole 54 may be inclined at a fixed angle.

The through hole 54 has, for example, a larger opening width than the opening 62. For example, an upper open end 54A (i.e., upper end) of the through hole 54 has a larger opening width than the lower open end 62A of the opening 62. For example, the through hole 54 extends from the lower open end 62A of the opening 62 to an inner side of the solder resist layer 60 and partially exposes an inner bottom surface of the solder resist layer 60 that extends sideward from the lower open end 62A of the opening 62. Therefore, in plan view, the upper open end 54A of the through hole 54 is located farther from the center of the opening 62 than the lower open end 62A of the opening 62. In addition, the upper open end 54A of the through hole 54 has a smaller opening width than the upper open end 61A of the recess 61. For example, in plan view, the upper open end 54A of the through hole 54 is located closer to the center of the opening 62 than the upper open end 61A of the recess 61.

A lower open end 54B (i.e., lower end) of the through hole 54 has a larger opening width than an upper open end 41A (i.e., upper end) of the through hole 41. For example, the through hole 54 exposes a portion of the upper surface of the insulation layer 40 extending sideward from the upper open end 41A of the through hole 41. Therefore, in plan view, the lower open end 54B of the through hole 54 is located farther from the center of the opening 62 than the upper open end 41A of the through hole 41. For example, in plan view, the lower open end 54B of the through hole 54 is located closer to the center of the opening 62 than the upper open end 54A of the through hole 54.

The through hole 54 is formed, for example, so that the wiring pattern 52 partially remains in the recess 61. For example, the through hole 54 exposes a portion of the wiring pattern 52. In other words, the wall surface of the through hole 54 may be formed by the wiring pattern 52. For example, the through hole 54 separates the wiring layer 50 into the wiring pattern 52 and the via wiring 51. In other words, the wiring pattern 52 is physically separated from the via wiring 51 by the through hole 54.

The recess 55 exposes a portion (upper surface in the example illustrated in FIG. 1B) of the via wiring 51. The recess 55 is located in the through hole 41. The recess 55 extends, for example, from the upper open end 41A of the through hole 41 to an intermediate position of the through hole 41 in the depth-wise direction. That is, the bottom surface of the recess 55 is located at the intermediate position of the through hole 41 in the depth-wise direction. Therefore, the bottom surface of the recess 55 is located at a lower position than the interface between the insulation layer 40 and the solder resist layer 60.

The recess 55 may have any planar shape and any size. The planar shape of the recess 55 may be, for example, the same as the planar shape of the opening 62. The planar shape of the recess 55 may be, for example, circular. For example, in plan view, the recess 55 and the upper part of the through hole 41 have the same planar shape and the same size. The depth of the recess 55 may be, for example, approximately 3 μm to 10 μm. The recess 55 is, for example, tapered so that the opening width (diameter) of the recess 55 is decreased from the upper side (the upper surface of the insulation layer 40) toward the lower side in FIG. 1B.

For example, in plan view, the wall surface of the recess 55 is inclined toward the center of the opening 62 as the wall surface extends from the upper surface of the insulation layer 40 toward the bottom surface of the recess 55 (the upper surface of the via wiring 51). The wall surface of the recess 55 does not necessarily have to be flat. The wall surface of the recess 55 may partially or entirely have an outward curve or an inward curve. In the example illustrated in FIG. 1B, in a cross-sectional view, the wall surface of the recess 55 has an inclined flat surface linearly extending without steps. The wall surface of the recess 55 may be inclined at a fixed angle.

The recess 55 has, for example, a smaller opening width than the through hole 54. For example, an upper open end 55A (i.e., upper end) of the recess 55 has a smaller opening width than the lower open end 54B (i.e., lower end) of the through hole 54. In the example illustrated in FIG. 1B, the upper open end 55A of the recess 55 conforms to the upper open end 41A of the through hole 41. However, in plan view, the upper open end 55A of the recess 55 may be located closer to the center of the through hole 41 than the upper open end 41A of the through hole 41. That is, when the entire wall surface of the through hole 41 is covered by the via wiring 51, the recess 55 may be formed on the upper surface of the via wiring 51. In the example illustrated in FIG. 1B, the recess 55 exposes an upper part of the wall surface of the through hole 41. That is, the wall surface of the recess 55 is formed by the upper part of the wall surface of the through hole 41. In other words, the wall surface of the recess 55 is formed by the insulation layer 40, which forms the wall surface of the through hole 41. For example, in a planar direction of the through hole 41 that is orthogonal to the depth-wise direction of the through hole 41 (sideward direction in FIG. 1B), the recess 55 extends over the entire upper part of the through hole 41. The upper surface of the via wiring 51 is exposed in the bottom of the recess 55 and is, for example, flat and parallel to the upper surface of the insulation layer 40. The via wiring 51 fills, for example, a lower part of the through hole 41.

The hole 53 is defined by, for example, a stepped wall surface formed by the wall surface of the through hole 54, the upper surface of the insulation layer 40 exposed from the through hole 54, and the wall surface of the recess 55.

The wiring layer 70 is formed on the wiring layer 50 exposed through the opening 62 and the hole 53 (the through hole 54 and the recess 55). The wiring layer 70 includes, for example, a via wiring 71 formed in the opening 62, the through hole 54, and the recess 55 and a wiring pattern 72 formed on the upper surface of the solder resist layer 60 and electrically connected to the wiring layer 50 by the via wiring 71. The via wiring 71 is an example of a second via wiring. The wiring pattern 72 is an example of a first wiring pattern.

The via wiring 71 fills, for example, the opening 62, the through hole 54, and the recess 55. The via wiring 71 is shaped in conformance with the shape of a via hole formed by the opening 62, the through hole 54, and the recess 55. In the example illustrated in FIG. 1B, the via wiring 71 covers the inner bottom surface of the solder resist layer 60, the side surface of the wiring pattern 52, and the upper surface of the insulation layer 40 that are exposed in the through hole 54. Thus, the via wiring 71 formed in the through hole 54 extends from the lower end of the opening 62 to the inner side of the solder resist layer 60. The side surface of the via wiring 71 formed in the through hole 54 is connected to the side surface of the wiring pattern 52, which forms the wall surface of the through hole 54. The via wiring 71 formed in the recess 55 covers the side surface of the insulation layer 40 (i.e., the wall surface of the through hole 41) and the upper surface of the via wiring 51 that are exposed in the recess 55. Thus, the lower end surface of the via wiring 71 formed in the recess 55 is connected to the upper surface of the via wiring 51, which forms the bottom surface of the recess 55. The interface between the lower end surface of the via wiring 71 and the via wiring 51 is located at a lower position than the interface between the insulation layer 40 and the solder resist layer 60.

The wiring layer 70 includes a seed layer 73 continuously covering the entire surface of the recess 55, the entire surface of the through hole 54, the entire surface of the opening 62, and the upper surface of the solder resist layer 60. In the example illustrated in FIG. 1B, the wall surface of the recess 55 includes the upper surface of the via wiring 51 exposed in the recess 55 and the side surface of the insulation layer 40 exposed in the recess 55. The wall surface of the through hole 54 includes the upper surface of the insulation layer 40 exposed in the through hole 54, the side surface of the wiring pattern 52 exposed in the through hole 54, and the inner bottom surface of the solder resist layer 60 exposed in the through hole 54. The wall surface of the opening 62 corresponds to the side surface of the solder resist layer 60 exposed in the opening 62. The seed layer 73 continuously covers all the surfaces described above. The material of the seed layer 73 may be, for example, copper or a copper alloy. The seed layer 73 may be, for example, an electroless plated metal layer formed through an electroless plating process.

The wiring layer 70 includes a metal layer 74 formed on the seed layer 73 and filling the opening 62, the through hole 54, and the recess 55. In the example illustrated in FIG. 1B, the metal layer 74 extends from the lower open end 62A of the opening 62 to the inner side of the solder resist layer 60. The material of the metal layer 74 may be, for example, copper or a copper alloy. The metal layer 74 may be, for example, an electrolytic plated metal layer formed through an electrolytic plating process.

As described above, the via wiring 71 of the wiring layer 70 is formed by the seed layer 73, which is formed in the opening 62, the through hole 54, and the recess 55, and the metal layer 74 formed on the seed layer 73. From a different viewpoint, the via wiring 71 includes three via parts, namely, an upper via part, an intermediate via part, and a lower via part. In the example illustrated in FIG. 1B, the upper via part corresponds to the part formed in the opening 62. The upper via part extends from a position of the upper surface of the solder resist layer 60 to an intermediate position of the solder resist layer 60. The intermediate via part corresponds to the part integrated with the upper via part and formed in the through hole 54 (i.e., partially formed in the recess 61). The intermediate via part extends from the intermediate position of the solder resist layer 60 to a position of the lower surface of the solder resist layer 60. The intermediate via part includes an anchor that extends sideward from the lower end of the upper via part (i.e., the lower open end 62A of the opening 62) to the inner side of the solder resist layer 60.

The anchor is in contact with the inner bottom surface of the solder resist layer 60. The lower via part corresponds to the part integrated with the intermediate via part and formed in the recess 55. The lower via part extends downward from a position of the upper surface of the insulation layer 40 and contacts the upper surface of the via wiring 51. In the example illustrated in FIG. 1B, the upper via part, the intermediate via part, and the lower via part are integrated with each other to be generally cross-shaped in a cross-sectional view.

The wiring layer 70 further includes a metal post 75. The metal post 75 is formed on the via wiring 71 (metal layer 74) and the seed layer 73 that is formed on the upper surface of the solder resist layer 60. The metal post 75 is rod-shaped and projects upward from the upper surface of the seed layer 73. The metal post 75 is formed, for example, integrally with the metal layer 74. The material of the metal post 75 may be, for example, copper or a copper alloy. The metal post 75 may be, for example, an electrolytic plated metal layer formed through an electrolytic plating process.

Thus, the wiring pattern 72 of the wiring layer 70 is formed by the seed layer 73 formed on the upper surface of the solder resist layer 60 and the metal post 75 formed on the seed layer 73.

The wiring pattern 72 is, for example, used as an electronic component mount pad electrically connected to an electronic component. The wiring pattern 72 is, for example, a rod-shaped connection terminal projecting upward from the upper surface of the solder resist layer 60. When appropriate, a surface-processed layer 76 is formed on the upper surface of the wiring pattern 72. The surface-processed layer 76 may be an Au layer, a Ni layer/Au layer, a Ni layer/Pd layer/Au layer, or an OSP film.

As described above, the terminal structure of the wiring substrate 10 is formed by the insulation layer 40, the wiring layer 50, the solder resist layer 60, and the wiring layer 70.

The structure of a semiconductor device 80 will now be described with reference to FIG. 2.

As illustrated in FIG. 2, the semiconductor device 80 includes the wiring substrate 10, one or more semiconductor elements 81 (in FIG. 2, one semiconductor element), an underfill resin 85, and the external connection terminals 86.

The semiconductor element 81 is flip-chip-mounted on the wiring substrate 10. That is, connection terminals 82 are disposed on a circuit formation surface (in FIG. 2, lower surface) of the semiconductor element 81 and are bonded to the wiring layer 70 of the wiring substrate 10 by a solder layer 83. Thus, the semiconductor element 81 is electrically connected to the wiring layer 70 by the connection terminals 82 and the solder layer 83. The solder layer 83 is bonded to the surface-processed layer 76 formed on the upper surface of the wiring layer 70 and the lower surface of each connection terminal 82.

The semiconductor element 81 may be, for example, a logic chip such as a central processing unit (CPU) chip or a graphics processing unit (GPU) chip. Alternatively, the semiconductor element 81 may be, for example, a memory chip such as a dynamic random access memory (DRAM) chip, a static random access memory (SRAM) chip, or a flash memory chip. Alternatively, multiple semiconductor elements 81 including a combination of a logic chip and a memory chip may be mounted on the wiring substrate 10.

The connection terminals 82 may be, for example, metal posts. The connection terminals 82 are, for example, rod-shaped connection terminals extending downward from the circuit formation surface of the semiconductor element 81. For example, the connection terminals 82 are cylindrical-rod-shaped. The material of the connection terminals 82 may be, for example, copper or a copper alloy. Alternatively, the connection terminals 82 may be, for example, metal bumps such as gold bumps instead of metal posts.

The solder layer 83 may be, for example, solder plating such as lead-free solder plating. For example, the material of the solder plating may be lead-free solder of Sn—Ag base, Sn—Cu base, Sn—Ag—Cu base, or Sn—Bi base.

The underfill resin 85 fills the space between the wiring substrate 10 and the semiconductor element 81. The material of the underfill resin 85 may be, for example, an insulative resin such as epoxy resin.

The external connection terminals 86 are formed on the external connection pads P1 of the wiring substrate 10. The external connection terminals 86 are used for, for example, electrical connection with pads that are disposed on a mount substrate such as a motherboard (not illustrated). The external connection terminals 86 may be, for example, solder balls or lead pins. In the example illustrated in FIG. 2, solder balls are used as the external connection terminals 86.

A method for manufacturing the wiring substrate 10 will now be described with reference to FIGS. 3A to 6B. A method for manufacturing the terminal structure of the wiring substrate 10 will be described in detail. To facilitate understanding, portions that ultimately become elements of the wiring substrate 10 are indicated by reference characters used to denote the final elements.

Figure 3A:
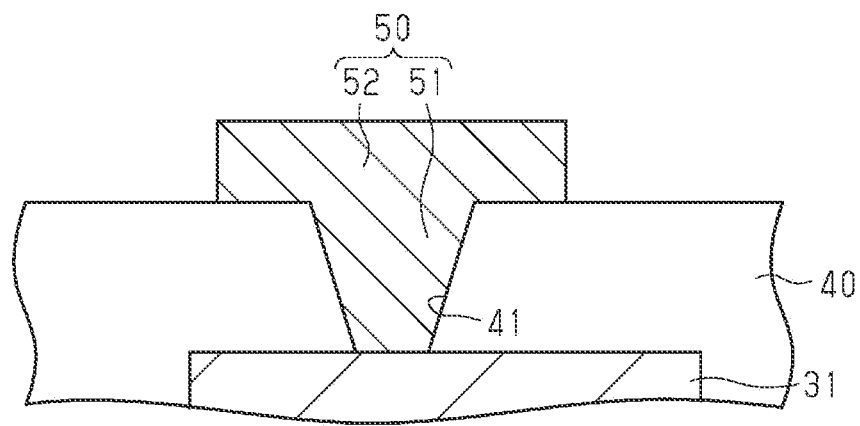
FIGS. 3A, 3B, 4A, 4B, 5A, 5B, 6A, and 6B are schematic enlarged partial cross-sectional views illustrating a method for manufacturing the wiring substrate illustrated in FIG. 1A.

As illustrated in FIG. 3A, the insulation layer 40 is formed to cover the wiring layer 31. The through hole 41 is formed to extend through the insulation layer 40 in the thickness-wise direction. The through hole 41 is filled with the via wiring 51. The wiring pattern 52 is formed on the upper surface of the insulation layer 40. The wiring pattern 52 is formed integrally with the via wiring 51. As a result, the wiring layer 50 that includes the via wiring 51 and the wiring pattern 52 is formed on the insulation layer 40, which covers the wiring layer 31. The structural body illustrated in FIG. 3A may be manufactured through a known manufacturing method. The detail will not be described.

Figure 3B:
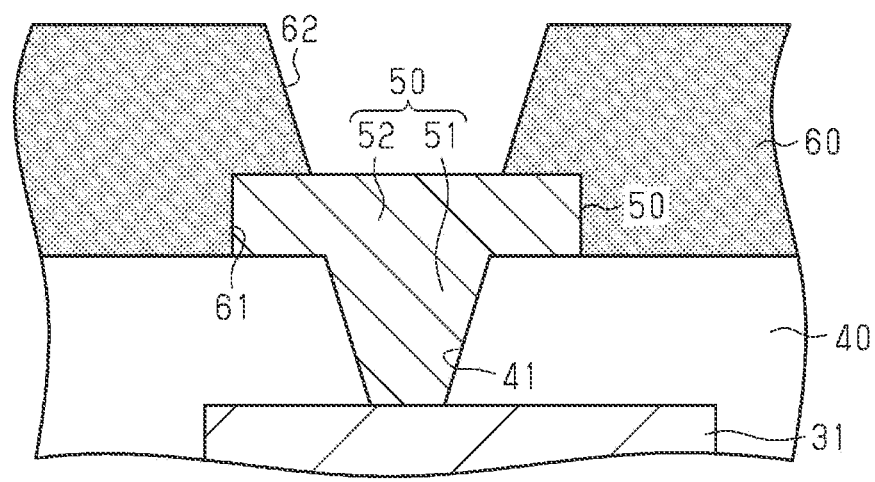

In the step illustrated in FIG. 3B, the solder resist layer 60 is formed on the upper surface of the insulation layer 40. The solder resist layer 60 includes the opening 62 partially exposing the upper surface of the wiring pattern 52. The solder resist layer 60 may be formed by, for example, laminating the insulation layer 40 and the wiring layer 50 with a photosensitive solder resist film or applying a liquid solder resist to the insulation layer 40 and the wiring layer 50 and patterning the resist through photolithography. The step illustrated in FIG. 3B forms the recess 61 in the lower surface of the solder resist layer 60 accommodating the wiring pattern 52.

Figure 4A:
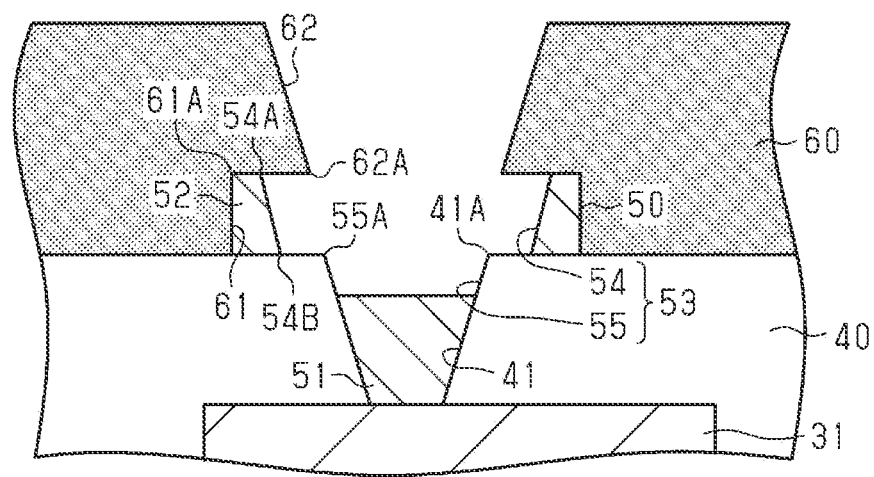

In the step illustrated in FIG. 4A, the hole 53 is formed in the upper surface of the wiring layer 50 exposed from the opening 62 in the solder resist layer 60. The hole 53 extends from the upper surface of the wiring pattern 52 to an intermediate position of the via wiring 51 in the thickness-wise direction. The forming of the hole 53 includes forming the through hole 54 that is connected to the opening 62 and extends through the wiring pattern 52 in the thickness-wise direction and forming the recess 55 in the upper surface of the via wiring 51 so that the recess 55 is connected to the through hole 54.

The through hole 54 and the recess 55 may be formed by, for example, performing wet etching on the wiring pattern 52 and the via wiring 51 when the solder resist layer 60 is used as an etching mask. When wet etching is performed on the wiring pattern 52, side etching, that is, etching progressing in an in-plane direction of the wiring pattern 52, occurs. The side etching forms the through hole 54 in the wiring pattern 52 that extends from the bottom of the opening 62 (lower open end 62A) to the inner side of the solder resist layer 60. As a result, the through hole 54 formed in the wiring pattern 52 has a larger opening width than the lower open end 62A of the opening 62.

The through hole 54 exposes a portion of the inner bottom surface of the solder resist layer 60 extending sideward from the lower open end 62A of the opening 62 and also exposes a portion of the upper surface of the insulation layer 40 extending sideward from the upper open end 41A of the through hole 41. The through hole 54 is formed so that the wiring pattern 52 partially remains in the recess 61. Thus, the surface wall of the through hole 54 is formed by the wiring pattern 52.

The recess 55 is formed in the upper surface of the via wiring 51 exposed in the bottom of the through hole 54. The opening width of the lower open end 54B of the through hole 54 is greater than the opening width of the upper open end 41A of the through hole 41 (i.e., the width of the upper surface of the via wiring 51). Thus, the recess 55 is formed in the entire upper surface of the via wiring 51. In an example, the recess 55 is formed by thinning the via wiring 51 from the upper surface. The recess 55 exposes a portion of the wall surface of the through hole 41 formed by the insulation layer 40. This forms the hole 53 (the through hole 54 and the recess 55) that extends from the upper surface of the wiring layer 50 exposed in the opening 62 of the solder resist layer 60 to the intermediate position of the through hole 41 (the via wiring 51) in the depth-wise direction.

Figure 4B:
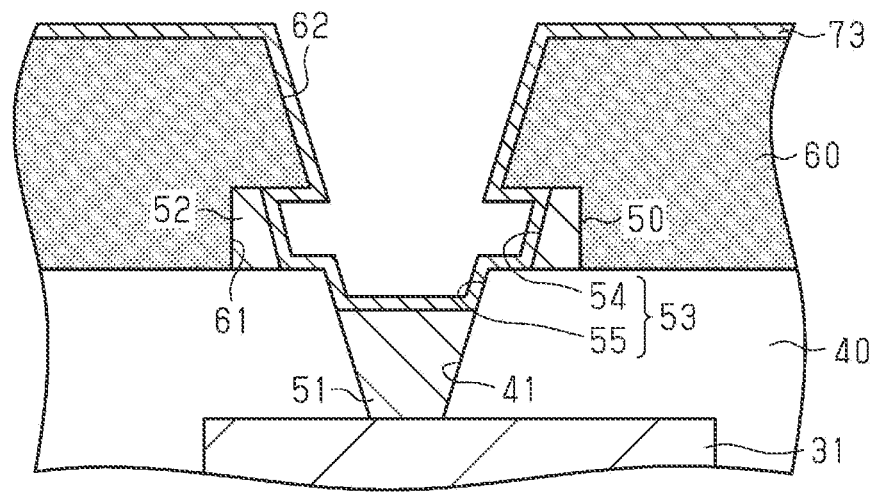

In the step illustrated in FIG. 4B, the seed layer 73 is formed to cover the entire upper surface of the solder resist layer 60, the entire surface of the opening 62, the entire surface of the through hole 54, and the entire surface of the recess 55. The wall surface of the opening 62 corresponds to the side surface of the solder resist layer 60 exposed in the opening 62. The wall surface of the through hole 54 includes the inner bottom surface of the solder resist layer 60 exposed in the through hole 54, the side surface of the wiring pattern 52 exposed in the through hole 54, and the upper surface of the insulation layer 40 exposed in the through hole 54. The wall surface of the recess 55 includes the side surface of the insulation layer 40 exposed in the recess 55 and the upper surface of the via wiring 51 exposed in the recess 55. The seed layer 73 may be formed, for example, through an electroless plating process. The seed layer 73 may be formed, for example, through an electroless copper plating process using a plating solution including a mixture of copper sulfate, sodium hydroxide, carboxylate, nickel sulfate, and formaldehyde.

Figure 5A:
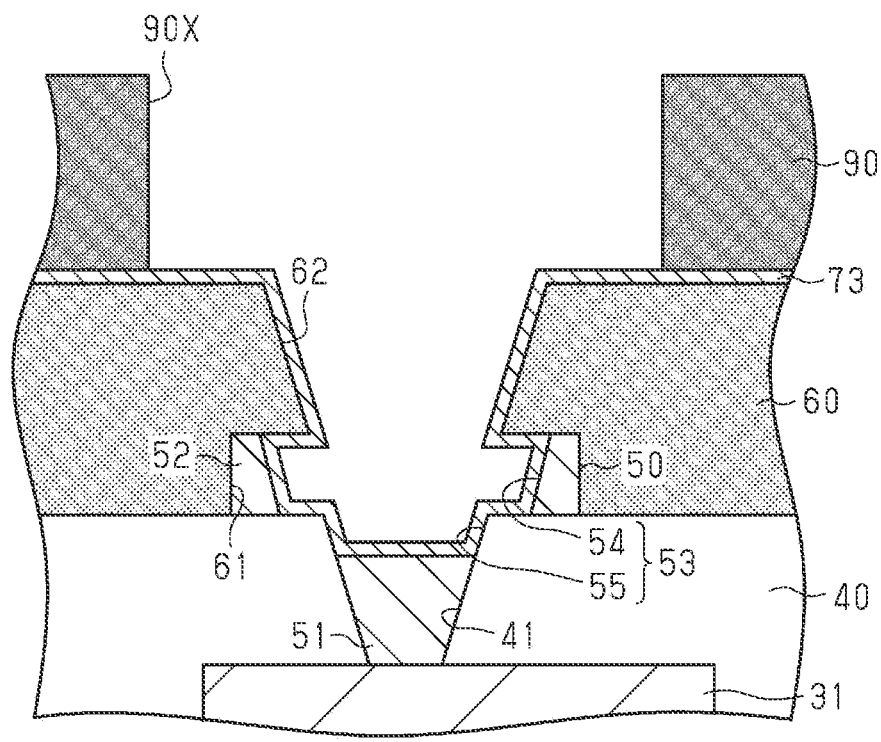

In the step illustrated in FIG. 5A, a resist layer 90 including an opening pattern 90X is formed on the seed layer 73 formed on the upper surface of the solder resist layer 60. The opening pattern 90X exposes a portion of the seed layer 73 corresponding to the region in which the metal post 75 (refer to FIG. 1B) is formed. For example, a material having resistance to the electrolytic plating process performed in the next step may be used as the material of the resist layer 90. For example, a photosensitive dry film resist or a liquid photoresist may be used as the resist layer 90. Such a resist material may be, for example, a novolac resin or an acrylic resin. For example, when a photosensitive dry film resist is used, the upper surface of the seed layer 73 is laminated with a dry film through thermocompression bonding, and the dry film is patterned through photolithography to form the resist layer 90 including the opening pattern 90X. When a liquid photoresist is used, the resist layer 90 may also be formed by the same steps.

Figure 5B:
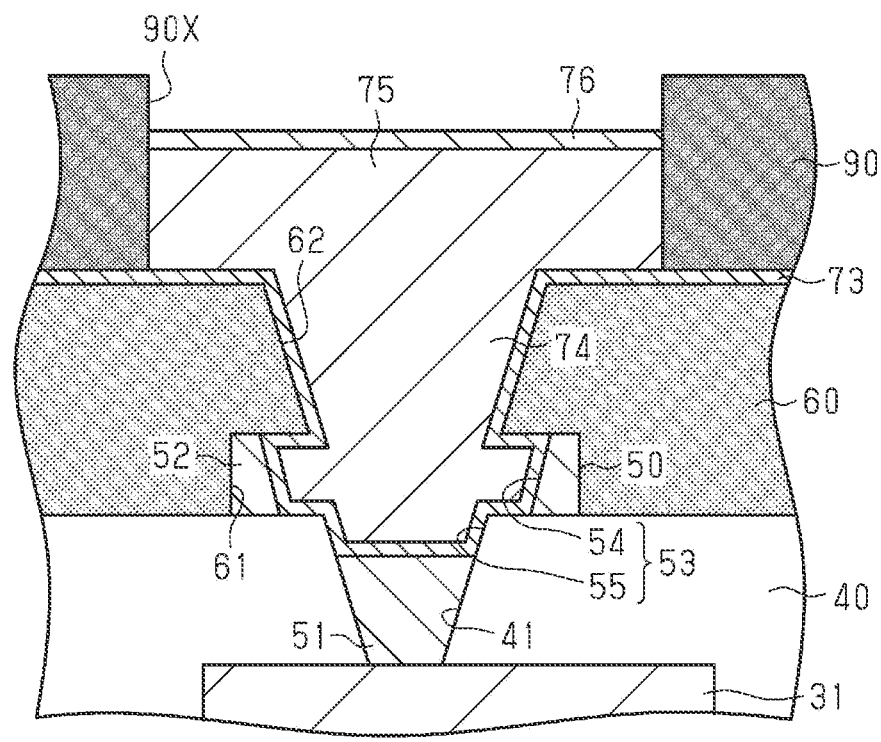

In the step illustrated in FIG. 5B, the electrolytic plating process is performed using the resist layer 90 as a plating mask and the seed layer 73 as a plating power feeding layer. That is, the electrolytic plating process (for example, electrolytic copper plating process) is performed on the upper surface of the seed layer 73 exposed from the opening pattern 90X in the resist layer 90. This step forms the metal layer 74 on the seed layer 73 in the opening 62 and the hole 53 (the through hole 54 and the recess 55). Further, the metal post 75 is formed integrally with the metal layer 74 on the seed layer 73 formed on the upper surface of the solder resist layer 60 in the opening pattern 90X.

When appropriate, the surface-processed layer 76 is formed on the upper surface of the metal post 75. The surface-processed layer 76 may be formed by, for example, an electrolytic plating process (for example, electrolytic copper plating process) that uses the resist layer 90 as a plating mask and the seed layer 73 (i.e., the metal layer 74 and the metal post 75 that are formed on the seed layer 73) as a plating power feeding layer.

Figure 6A:
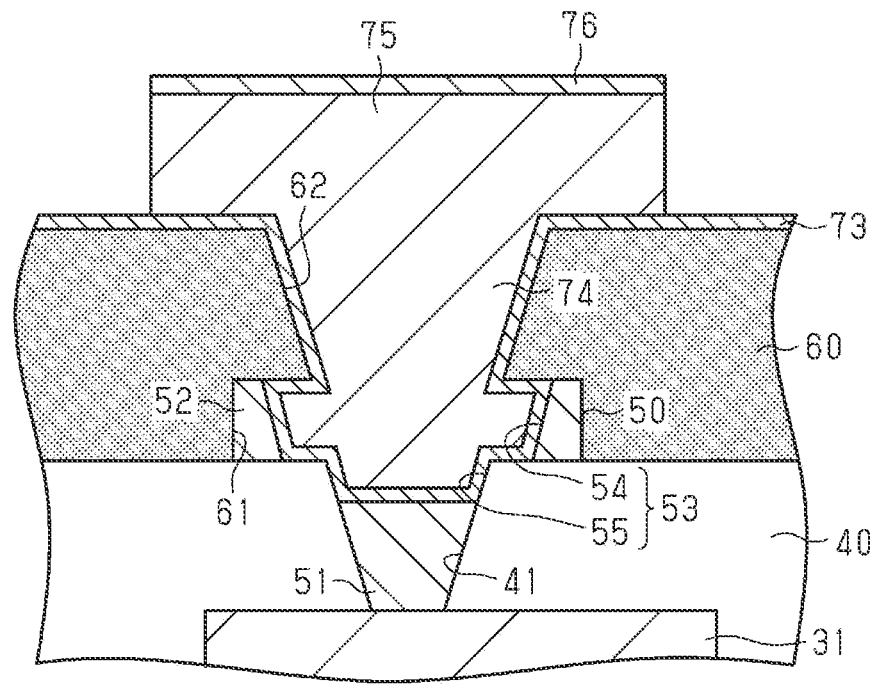

In the step illustrated in FIG. 6A, the resist layer 90 illustrated in FIG. 5B is removed by an alkaline stripping solution (e.g., organic amine stripping solution, caustic soda, acetone, or ethanol).

Figure 6B:
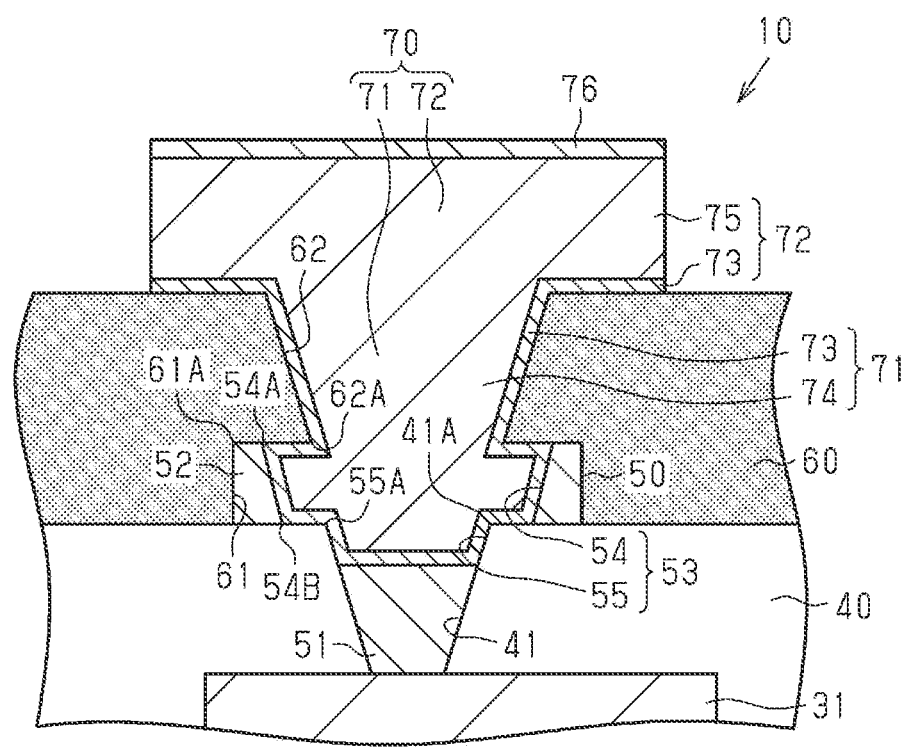

As illustrated in FIG. 6B, as the metal post 75 is used as an etching mask, an unwanted portion of the seed layer 73 is removed by etching. When the seed layer 73 is an electroless copper plated layer, for example, the unwanted portion of the seed layer 73 is removed by wet etching using a sulfuric acid-hydrogen peroxide-based etchant. As a result, the wiring layer 70 includes the via wiring 71 that includes the seed layer 73 and the metal layer 74 in the opening 62 and the hole 53, and the wiring pattern 72 that includes the seed layer 73 and the metal post 75 on the upper surface of the solder resist layer 60. The manufacturing steps described above manufacture the wiring substrate 10 illustrated in FIGS. 1A and 1B.

The wiring substrate 10 of the embodiment has the following advantages.

(1) The opening 62 is formed in the upper surface of the solder resist layer 60. The recess 61 is formed in the lower surface of the solder resist layer 60 and connected to the opening 62. In addition, the recess 55 is formed in the upper surface of the via wiring 51 and connected to the recess 61. The via wiring 71 is formed in the opening 62, the recess 61, and the recess 55. The via wiring 71 extends from the upper surface of the solder resist layer 60 to an intermediate position of the via wiring 51 in the thickness-wise direction. The lower end surface and the side surface of the via wiring 71 are connected to the wiring layer 50. This structure increases the area of contact of the via wiring 71 with the wiring layer 50 as compared to, for example, a structure in which only the lower end surface of the via wiring 71 is connected to the upper surface of the wiring pattern 52. Thus, for example, when the semiconductor element 81 is mounted on the wiring substrate 10, formation of cracks in the interface between the via wiring 71 and the wiring layer 50 caused by stress is limited even when a large amount of stress is applied to the vicinity of the interface between the via wiring 71 and the wiring layer 50. Accordingly, separation of the via wiring 71 from the wiring layer 50 is effectively limited. As a result, the connection reliability between the via wiring 71 and the wiring layer 50 is improved.

(2) The insulation layer 40 and the solder resist layer 60 have different thermal expansion coefficients. In this structure, for example, when the wiring substrate 10 undergoes a reliability test using thermal cycle, thermal stress is generated based on the difference in thermal expansion coefficient between the insulation layer 40 and the solder resist layer 60. The thermal stress concentrates on the interface between the insulation layer 40 and the solder resist layer 60. This facilitates formation of cracks in the interface between the insulation layer 40 and the solder resist layer 60. Such cracks propagate in a direction in which the interface between the insulation layer 40 and the solder resist layer 60 extends, that is, the planar direction of the wiring substrate 10. In this case, if the interface between the lower end surface of the via wiring 71 and the via wiring 51 is coplanar with the interface between the insulation layer 40 and the solder resist layer 60, the cracks propagating in the planar direction cracks are likely to be formed in portions connecting the via wiring 71 and the via wiring 51 caused by the cracks propagated in the planar direction. In this regard, in the wiring substrate 10, the interface between the lower end surface of the via wiring 71 and the via wiring 51 is located at a lower position than the interface between the insulation layer 40 and the solder resist layer 60. In other words, the interface between the lower end surface of the via wiring 71 and the via wiring 51 is not coplanar with the interface between the insulation layer 40 and the solder resist layer 60. Therefore, even if cracks are formed in the interface between the insulation layer 40 and the solder resist layer 60, resulting cracks in the interface between the lower end surface of the via wiring 71 and the via wiring 51 are less likely to form. Accordingly, separation of the via wiring 71 from the wiring layer 50 is effectively limited.

(3) The wiring pattern 52 is formed in the recess 61 of the solder resist layer 60. The through hole 54 extends through the wiring pattern 52 in the thickness-wise direction. The opening 62, the through hole 54, and the recess 55 are filled with the via wiring 71. In this structure, the wall surface of the through hole 54 is formed by the wiring pattern 52. The side surface of the via wiring 71 is in contact with the wiring pattern 52 formed in the through hole 54. This increases the area of contact of the via wiring 71 with the wiring layer 50, thereby effectively limiting formation of cracks in the interface between the via wiring 71 and the wiring layer 50.

(4) The upper open end 54A of the through hole 54 has a larger opening width than the lower open end 62A of the opening 62. The through hole 54 is filled with the via wiring 71. Thus, a portion of the via wiring 71, that is, the portion of the via wiring 71 filling the through hole 54, extends to the inner side of the solder resist layer 60. This structure produces an anchor effect and improves the adhesion between the via wiring 71 and the solder resist layer 60. Accordingly, separation of the via wiring 71 (the wiring layer 70) from the solder resist layer 60 is effectively limited. Thus, the connection reliability between the wiring layer 50 and the wiring layer 70 is improved.

It should be apparent to those skilled in the art that the foregoing embodiments may be implemented in many other specific forms without departing from the scope of this disclosure. Particularly, it should be understood that the foregoing embodiments may be implemented in the following forms.

Other Embodiments

The embodiment may be modified as follows. The embodiment and the modified examples described below may be combined as long as the combined modified examples remain technically consistent with each other.

In the embodiment (refer to FIG. 1B), the through hole 54 is formed so that the lower end (the lower open end 54B) of the through hole 54 has a larger opening width than the upper end (the upper open end 41A) of the through hole 41. Alternatively, the structure described below may be used.

Figure 7:
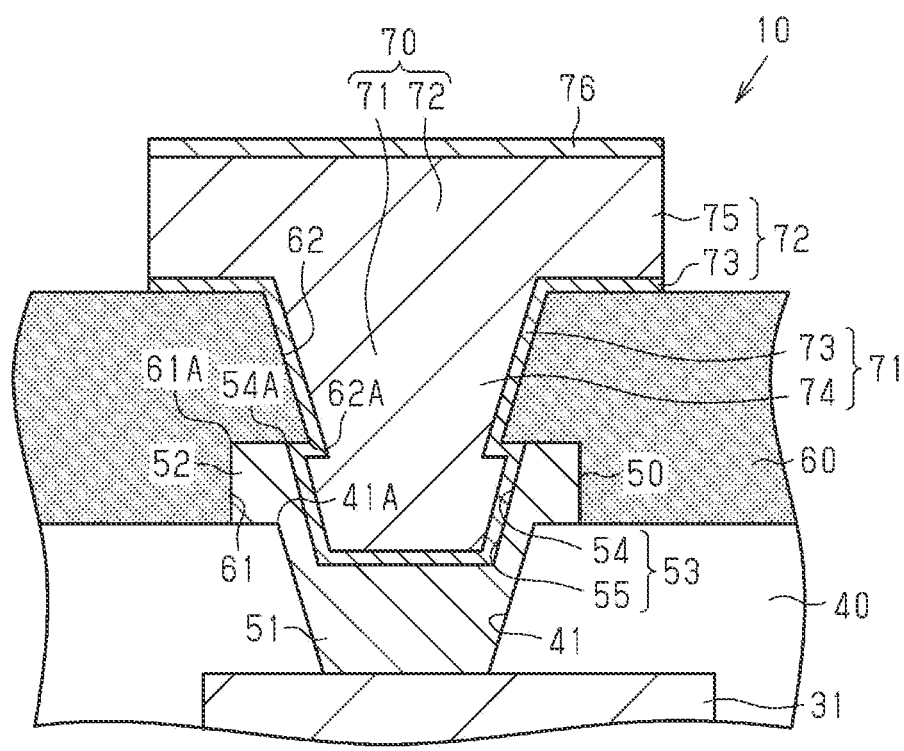
FIG. 7 is a schematic enlarged partial cross-sectional view illustrating a modified example of a wiring substrate.

FIG. 7 illustrates a modified example of the wiring substrate 10. As illustrated in FIG. 7, the through hole 54 may be formed so that the lower end of the through hole 54 has a smaller opening width than the upper open end 41A of the through hole 41. In this case, the through hole 54 does not expose the upper surface of the insulation layer 40. In the modified example illustrated in FIG. 7, the recess 55 is formed so that the recess 55 has a smaller opening width than the through hole 41. In this case, the recess 55 does not expose the wall surface of the through hole 41 formed by the insulation layer 40. In this structure, the wall surface of the recess 55 is formed by the via wiring 51. For example, the recess 55 is formed in a portion of the upper surface of the via wiring 51.

In the modified example illustrated in FIG. 7, the wall surface of the recess 55 is continuous with the wall surface of the through hole 54. Therefore, the wall surface of the hole 53 is formed as a flat surface in which the wall surface of the through hole 54 is continuous with the wall surface of the recess 55. For example, in a cross-sectional view, the wall surface of the through hole 54 and the wall surface of the recess 55 are flat and extend linearly from the upper end of the through hole 54 to the lower end of the recess 55 without having a step.

The hole 53 (the through hole 54 and the recess 55) is tapered so that the opening width (diameter) of the hole 53 is decreased from the upper side (the upper surface of the wiring layer 50) toward the lower side in FIG. 7. In the modified example illustrated in FIG. 7, in a cross-sectional view, the wall surface of the through hole 54 and the wall surface of the recess 55 are inclined and flat and extend linearly from the upper end of the through hole 54 to the lower end of the recess 55 without having a step. The wall surface of the through hole 54 and the wall surface of the recess 55 may be inclined at a fixed angle from the upper end of the through hole 54 to the lower end of the recess 55. The wall surface of the through hole 54 and the wall surface of the recess 55 do not necessarily have to be flat. The wall surface of the through hole 54 and/or the wall surface of the recess 55 may partially or entirely have an outward curve or an inward curve. The upper open end 54A of the through hole 54 has a larger opening width than the lower open end 62A of the opening 62.

In the modified example illustrated in FIG. 7, the via wiring 71 fills the opening 62 and the hole 53 (the through hole 54 and the recess 55). The side surface of the via wiring 71 formed in the hole 53 is connected to the wiring pattern 52 forming the wall surface of the through hole 54 and the via wiring 51 forming the wall surface of the recess 55. The lower surface of the via wiring 71 is connected to the via wiring 51, which forms the bottom surface of the recess 55.

In this structure, since the opening width of the recess 55 is smaller than the opening width of the through hole 41, the via wiring 71 filled in the recess 55 has a smaller width than the via wiring 51 filled in the through hole 41. This allows the via wiring 71 formed in the recess 55 to contact the via wiring 51, which forms the wall surface of the recess 55. As a result, the area of contact of the via wiring 71 with the via wiring 51 is increased in a lamination direction of the wiring substrate 10 (upper-lower direction in FIG. 7). The structure is resistant to breakage in the interface between the via wiring 71 and the via wiring 51 caused by stress generated in the planar direction (sideward direction in FIG. 7) orthogonal to the lamination direction of the wiring substrate 10.

In the same manner as in the embodiment (refer to FIG. 1B), in the modified example illustrated in FIG. 7, the via wiring 71 includes three via parts, namely the upper via part, the intermediate via part, and the lower via part. In FIG. 7, the upper via part corresponds to the part formed in the opening 62. The upper via part extends from a position of the upper surface of the solder resist layer 60 to an intermediate position of the solder resist layer 60. The intermediate via part corresponds to the part integrated with the upper via part and formed in the through hole 54 (i.e., partially formed in the recess 61). The intermediate via part extends from the intermediate position of the solder resist layer 60 to a position of the lower surface of the solder resist layer 60. The intermediate via part includes an anchor that extends sideward from the lower end of the upper via part (i.e., the lower open end 62A of the opening 62) to the inner side of the solder resist layer 60. The anchor is in contact with the inner bottom surface of the solder resist layer 60. The lower via part corresponds to the part integrated with the intermediate via part and formed in the recess 55. The lower via part extends downward from a position of the upper surface of the insulation layer 40 and contacts the via wiring 51. In the modified example illustrated in FIG. 7, the upper via part, the intermediate via part, and the lower via part are integrated with each other to be generally inverted-T-shaped in a cross-sectional view.

A method for manufacturing the wiring substrate 10 of the modified example illustrated in FIG. 7 will now be described.

Figure 8:
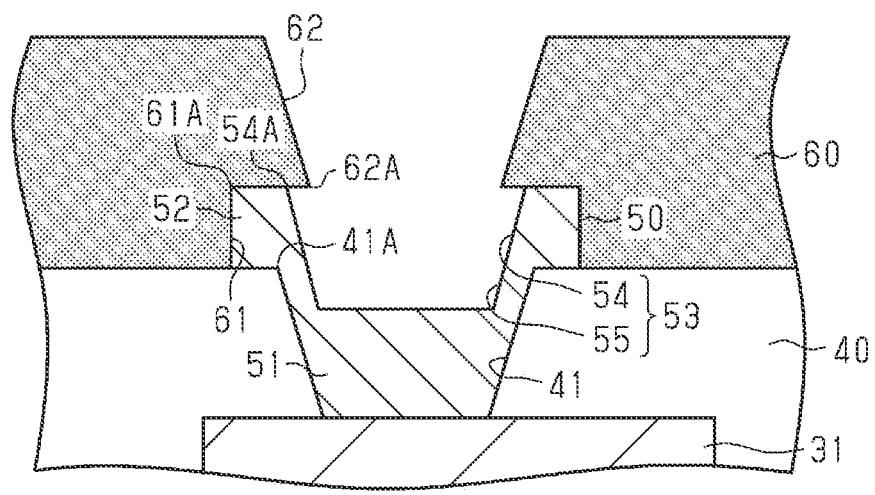
FIGS. 8, 9A, and 9B are schematic enlarged partial cross-sectional views illustrating a method for manufacturing the wiring substrate illustrated in FIG. 7.

In the step illustrated in FIG. 8, the same steps as the steps illustrated in FIGS. 3A and 3B are performed to form the solder resist layer 60 on the upper surface of the insulation layer 40. The solder resist layer 60 includes the opening 62 partially exposing the upper surface of the wiring pattern 52. The hole 53 is formed in the upper surface of the wiring layer 50 exposed from the opening 62 of the solder resist layer 60. The hole 53 is connected to the opening 62 and extends to an intermediate position of the via wiring 51 in the thickness-wise direction. The forming of the hole 53 includes forming the through hole 54 that is connected to the opening 62 and extends through the wiring pattern 52 in the thickness-wise direction and forming the recess 55 in the upper surface of the via wiring 51 so that the recess 55 is connected to the through hole 54. The through hole 54 and the recess 55 may be formed by performing wet etching on the wiring pattern 52 and the via wiring 51 when the solder resist layer 60 is used as an etching mask in the same manner as the step illustrated in FIG. 4A. However, in the step illustrated in FIG. 8, the through hole 54 and the recess 55 are formed so that the opening width of the lower end of the through hole 54 and the opening width of the upper end of the recess 55 are smaller than the opening width of the upper open end 41A of the through hole 41. The opening width of the upper end of the recess 55 (i.e., the opening width of the lower end of the through hole 54) may be adjusted based on, for example, the processing time of wet etching and/or the composition of the etchant.

Figure 9A:
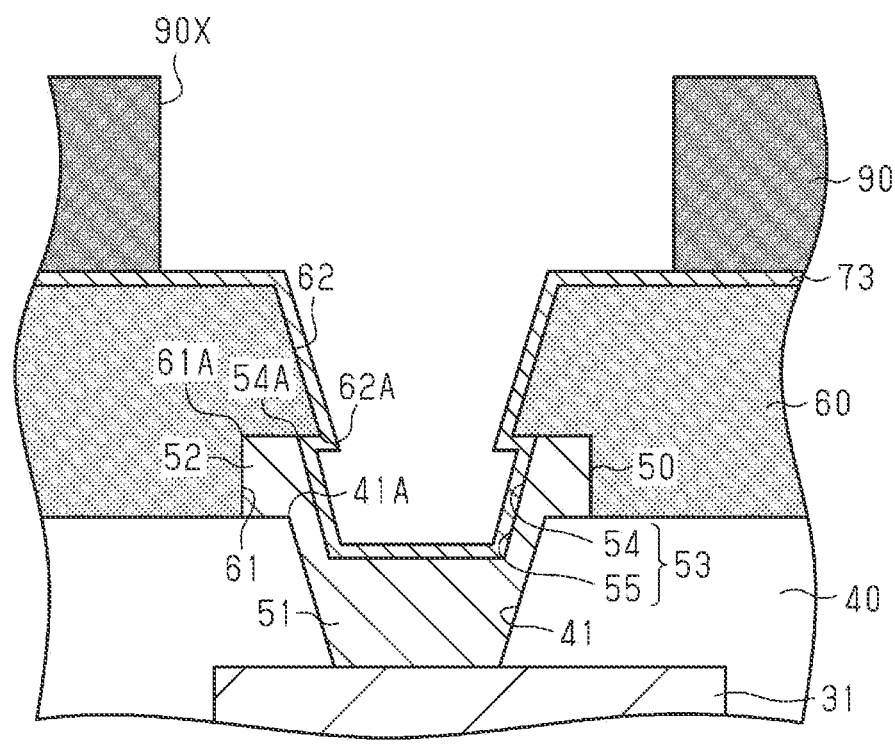

In the step illustrated in FIG. 9A, in the same manner as the step illustrated in FIG. 4B, the seed layer 73 is formed to cover the entire upper surface of the solder resist layer 60, the entire surface of the opening 62, the entire surface of the through hole 54, and the entire surface of the recess 55. In the same manner as the step illustrated in FIG. 5A, a resist layer 90 including an opening pattern 90X is formed on the seed layer 73 formed on the upper surface of the solder resist layer 60.

Figure 9B:
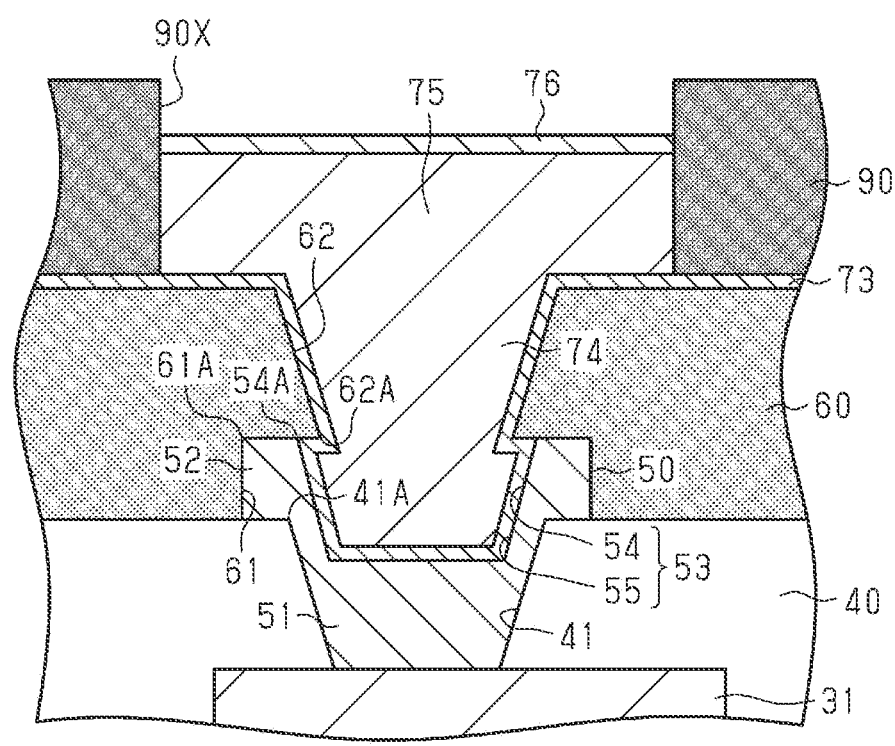

In the step illustrated in FIG. 9B, in the same manner as the step illustrated in FIG. 5B, the electrolytic plating process is performed using the resist layer 90 as a plating mask and the seed layer 73 as a plating power feeding layer. That is, the electrolytic plating process is performed on the upper surface of the seed layer 73 exposed from the opening pattern 90X in the resist layer 90. This step forms the metal layer 74 on the seed layer 73 in the opening 62 and the hole 53 (the through hole 54 and the recess 55). Further, the metal post 75 is formed integrally with the metal layer 74 on the seed layer 73 formed on the upper surface of the solder resist layer 60 in the opening pattern 90X. Subsequently, when appropriate, the surface-processed layer 76 is formed on the upper surface of the metal post 75.

In the same manner as the steps illustrated in FIGS. 6A and 6B, the resist layer 90 is removed by an alkaline stripping solution, and an unwanted portion of the seed layer 73 is removed by etching. The steps described above manufacture the wiring substrate 10 of the modified example illustrated in FIG. 7.

In the embodiment (refer to FIG. 1B), the wiring pattern 52 and the via wiring 71 are formed in the recess 61 of the solder resist layer 60. Alternatively, the structure described below may be used.

FIG. 10 illustrates a wiring substrate 10A according to another modified example. As illustrated in FIG. 10, the recess 61 may be filled with the via wiring 71. In the wiring substrate 10A, for example, the recess 61 is arranged to overlap the wiring pattern 72 in plan view and is filled with only the via wiring 71. The wiring pattern 52 (refer to FIG. 1B) is not formed in the recess 61. In other words, the through hole 54 is formed in a position overlapping the wiring pattern 72 in plan view to expose the entire surface of the recess 61. The through hole 54 is filled with the via wiring 71. In the modified example illustrated in FIG. 10, the through hole 54 has the same shape and the same size as the recess 61 formed in a position overlapping the wiring pattern 72 in plan view. The recess 61 (through hole 54) exposes the inner bottom surface of the solder resist layer 60 extending sideward from the lower open end 62A of the opening 62 and also exposes the upper surface of the insulation layer 40 extending sideward from the upper open end 41A of the through hole 41. The entire surface of the through hole 54 is formed by only resin layers (in this example, the solder resist layer 60 and the insulation layer 40).

In the modified example illustrated in FIG. 10, the via wiring 71 fills the opening 62, the recess 61 (the through hole 54), and the recess 55. That is, the via wiring 71 is shaped in conformance with the shape of a via hole defined by the opening 62, the recess 61 (the through hole 54), and the recess 55. The side surface of the via wiring 71 formed in the recess 61 is shaped along the wall surface of the recess 61. Thus, the side surface of the via wiring 71 formed in the recess 61 extends perpendicular to the upper surface of the insulation layer 40 in a cross-sectional view. The side surface of the via wiring 71 formed in the recess 61 is not limited to a perpendicular flat surface and may be a curved surface or a tapered surface.

In the modified example illustrated in FIG. 10, the via wiring 71 includes the seed layer 73 continuously covering the entire surface of the opening 62, the entire surface of the recess 61 (the through hole 54), and the entire surface of the recess 55. The wall surface of the opening 62 corresponds to the side surface of the solder resist layer 60 exposed in the opening 62. The wall surface of the recess 61 (the through hole 54) includes the inner bottom surface and the side surface of the solder resist layer 60 exposed in the recess 61 (the through hole 54) and the upper surface of the insulation layer 40 exposed in the recess 61 (the through hole 54). The wall surface of the recess 55 includes the side surface of the insulation layer 40 exposed in the recess 55 and the upper surface of the via wiring 51 exposed in the recess 55. The seed layer 73 continuously covers all the surfaces described above. The via wiring 71 includes the metal layer 74 formed on the seed layer 73 and filling the opening 62, the recess 61 (the through hole 54), and the recess 55.

In this structure, since the recess 61 is filled with only the via wiring 71, only the via wiring 71 is formed in the recess 61. Thus, the interface between the via wiring 71 and the wiring pattern 52 (refer to FIG. 1B) does not exist in the recess 61. This obviates formation of cracks in the interface between the via wiring 71 and the wiring pattern 52.

In the same manner as in the embodiment (refer to FIG. 1B), in the modified example illustrated in FIG. 10, the via wiring 71 includes three via parts, namely the upper via part, the intermediate via part, and the lower via part. In FIG. 10, the upper via part corresponds to the part formed in the opening 62. The upper via part extends from a position of the upper surface of the solder resist layer 60 to an intermediate position of the solder resist layer 60. The intermediate via part corresponds to the part integrated with the upper via part and formed in the through hole 54 (i.e., entirely formed in the recess 61). The intermediate via part extends from the intermediate position of the solder resist layer 60 to a position of the lower surface of the solder resist layer 60. The intermediate via part includes an anchor that extends sideward from the lower end of the upper via part (i.e., the lower open end 62A of the opening 62) to the inner side of the solder resist layer 60. The anchor is in contact with the inner bottom surface of the solder resist layer 60. The lower via part corresponds to the part integrated with the intermediate via part and formed in the recess 55. The lower via part extends downward from a position of the upper surface of the insulation layer 40 and contacts the via wiring 51. In the modified example illustrated in FIG. 10, the upper via part, the intermediate via part, and the lower via part are integrated with each other to be generally cross-shaped in a cross-sectional view.

In the modified example illustrated in FIG. 10, the solder resist layer 60 includes a recess 63 formed in the lower surface of the solder resist layer 60 and an opening 64 formed in the upper surface of the solder resist layer 60 and connected to the recess 63. The opening 64 is, for example, located directly above the recess 63. The opening 64 is arranged to overlap the recess 63 in plan view. The recess 63 is arranged in a position that does not overlap the through hole 41 of the insulation layer 40 in plan view.

The opening 64 is, for example, tapered so that the opening width (diameter) of the opening 64 is decreased from the upper side (the upper surface of the solder resist layer 60) toward the lower side in FIG. 10. For example, in plan view, the wall surface of the opening 64 is inclined toward the center of the opening 64 as the wall surface extends from the upper surface of the solder resist layer 60 toward the recess 63. The wall surface of the opening 64 does not necessarily have to be flat. The wall surface of the opening 64 may partially or entirely have an outward curve or an inward curve. In the example illustrated in FIG. 10, in a cross-sectional view, the wall surface of the opening 64 has an inclined flat surface linearly extending without steps. The wall surface of the opening 64 may be inclined at a fixed angle.

The recess 63 exposes, for example, a portion of the upper surface of the insulation layer 40. The opening width of an upper open end 63A (i.e., upper end) of the recess 63 is larger than the opening width of a lower open end 64A (i.e., lower end) of the opening 64. The wall surface of the recess 63 extends, for example, perpendicular to the upper surface of the insulation layer 40 in a cross-sectional view. The wall surface of the recess 63 is not limited to a perpendicular flat surface and may be a curved surface or a tapered surface.

The wiring layer 70 includes, for example, a via wiring 71A formed in the opening 64 and the recess 63 and a wiring pattern 72A formed on the upper surface of the solder resist layer 60 integrally with the via wiring 71A.

The via wiring 71A fills, for example, the opening 64 and the recess 63. The via wiring 71A is shaped in conformance with the shape of a via hole defined by the opening 64 and the recess 63. In the modified example illustrated in FIG. 10, the via wiring 71A covers the inner bottom surface of the solder resist layer 60, the side surface of the solder resist layer 60, and the upper surface of the insulation layer 40 that are exposed in the recess 63. Thus, the via wiring 71A formed in the recess 63 extends from the lower end of the opening 64 to the inner side of the solder resist layer 60. The side surface of the via wiring 71A formed in the recess 63 is in contact with the side surface of the solder resist layer 60, which forms the wall surface of the recess 63. The side surface of the via wiring 71A formed in the recess 63 is shaped along the wall surface of the recess 63. Thus, the side surface of the via wiring 71A formed in the recess 63 extends perpendicular to the upper surface of the insulation layer 40 in a cross-sectional view.

The via wiring 71A includes a seed layer 73A continuously covering the entire surface of the opening 64 and the entire surface of the recess 63. The wall surface of the opening 64 corresponds to the side surface of the solder resist layer 60 exposed in the opening 64. The wall surface of the recess 63 includes the inner bottom surface and the side surface of the solder resist layer 60 exposed in the recess 63 and the upper surface of the insulation layer 40 exposed in the recess 63. The seed layer 73A continuously covers all the surfaces described above. The via wiring 71A includes a metal layer 74A that is formed on the seed layer 73A and fills the opening 64 and the recess 63.

The wiring pattern 72A includes a seed layer 73A formed on the upper surface of the solder resist layer 60. The wiring pattern 72A further includes a metal post 75A formed on the via wiring 71A (the metal layer 74A) and the seed layer 73A formed on the upper surface of the solder resist layer 60. The metal post 75A is rod-shaped and projects upward from the upper surface of the seed layer 73A. The metal post 75A is formed, for example, integrally with the metal layer 74A.

In this structure, since the recess 63 is filled with only the via wiring 71A, only the via wiring 71A is formed in the recess 63. Thus, the interface between the via wiring 71A and the wiring pattern 52 (refer to FIG. 1A) does not exist in the recess 63. This obviates formation of cracks in the interface between the via wiring 71A and the wiring pattern 52.

A method for manufacturing the wiring substrate 10A of the modified example illustrated in FIG. 10 will now be described.

Figure 11:
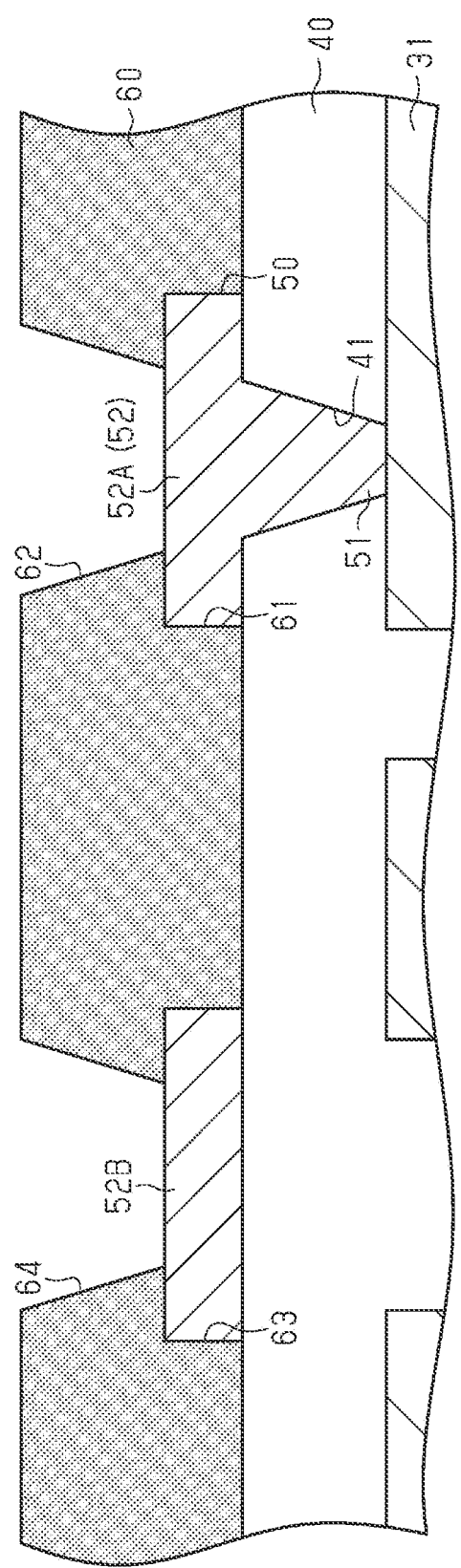
FIGS. 11, 12, 13, and 14 are schematic enlarged partial cross-sectional views illustrating a method for manufacturing the wiring substrate illustrated in FIG. 10.

In the step illustrated in FIG. 11, the same steps as the steps illustrated in FIGS. 3A and 3B are performed to form the solder resist layer 60 on the upper surface of the insulation layer 40. The wiring pattern 52 includes a wiring pattern 52A located directly above the via wiring 51 and a wiring pattern 52B located at a position that does not overlap the via wiring 51 in plan view. The solder resist layer 60 includes the opening 62 that exposes a portion of the upper surface of the wiring pattern 52A and the opening 64 that exposes a portion of the upper surface of the wiring pattern 52B. When the step illustrated in FIG. 11 is performed, the recess 61 accommodating the wiring pattern 52A and the recess 63 accommodating the wiring pattern 52B are formed in the lower surface of the solder resist layer 60.

Figure 12:
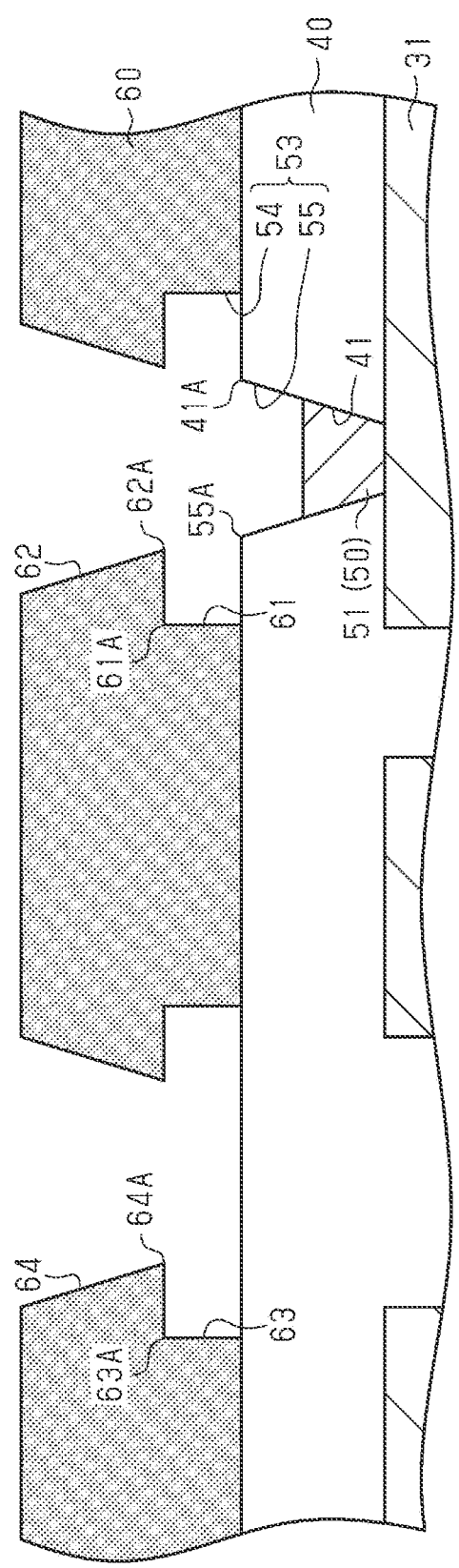

In the step illustrated in FIG. 12, in the same manner as the step illustrated in FIG. 4A, wet etching is performed on the wiring patterns 52A and 52B and the via wiring 51 using the solder resist layer 60 as an etching mask. In this step, as illustrated in FIG. 12, the hole 53 is formed in the upper surface of the wiring layer 50 exposed from the opening 62 of the solder resist layer 60. The hole 53 is connected to the opening 62 and extends to an intermediate position of the via wiring 51 in the thickness-wise direction. The forming of the holes 53 includes removing the wiring pattern 52A (refer to FIG. 11) from the recess 61 to form the through hole 54 that exposes the entire surface of the recess 61 and forming the recess 55 in the upper surface of the via wiring 51 so that the recess 55 is connected to the through hole 54. In this step, the wiring pattern 52B (refer to FIG. 11) is removed from the recess 63, so that the entire surface of the recess 63 is exposed. In other words, wet etching is performed to entirely expose the wall surfaces of the recesses 61 and 63.

Figure 13:
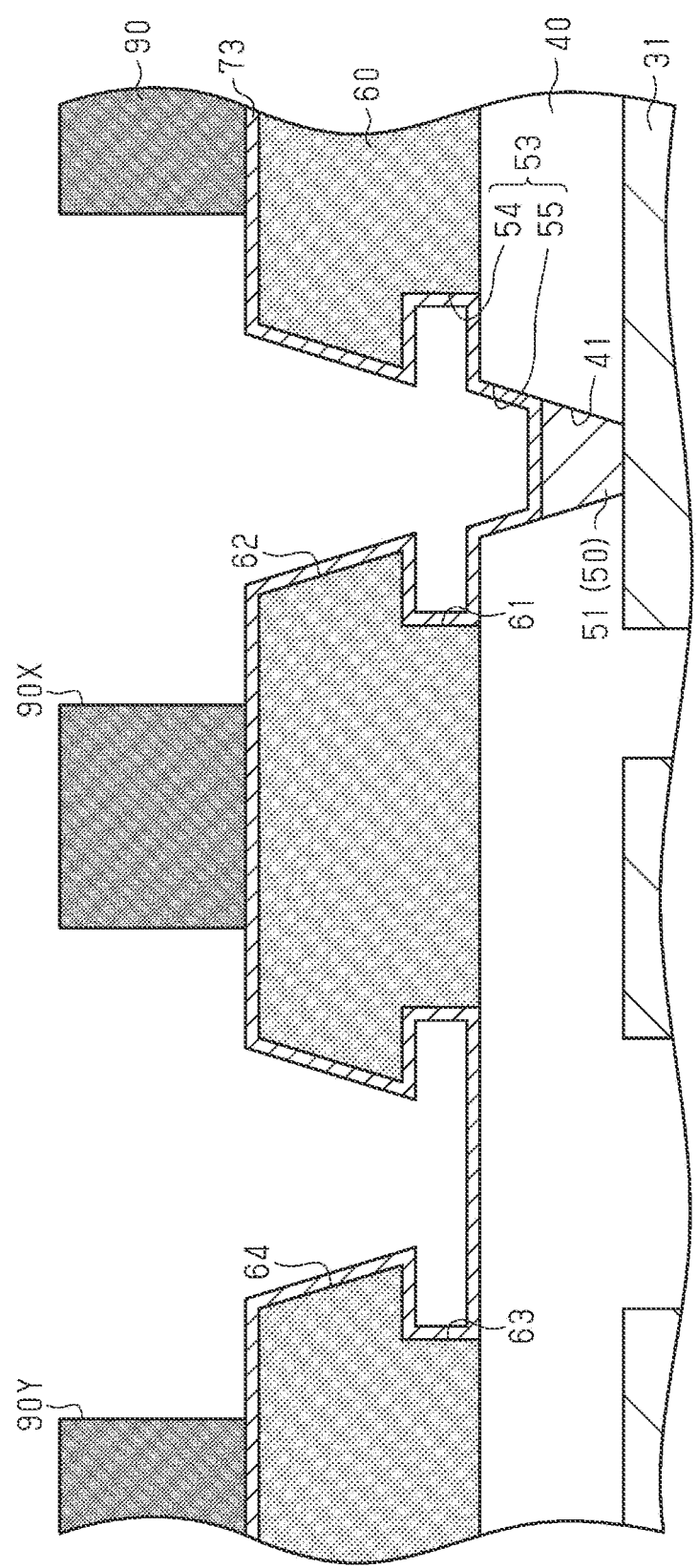

In the step illustrated in FIG. 13, in the same manner as the step illustrated in FIG. 4B, the seed layer 73 is formed to continuously cover the entire surface of the opening 62, the entire surface of the recess 61 (the through hole 54), the entire surface of the recess 55, the entire upper surface of the solder resist layer 60, the entire surface of the opening 64, and the entire surface of the recess 63. In the same manner as the step illustrated in FIG. 5A, a resist layer 90 including opening patterns 90X and 90Y is formed on the seed layer 73 formed on the upper surface of the solder resist layer 60. The opening pattern 90X exposes a portion of the seed layer 73 corresponding to the region in which the metal post 75 (refer to FIG. 10) is formed. The opening pattern 90Y exposes a portion of the seed layer 73 corresponding to the region in which the metal post 75A (refer to FIG. 10) is formed.

Figure 14:
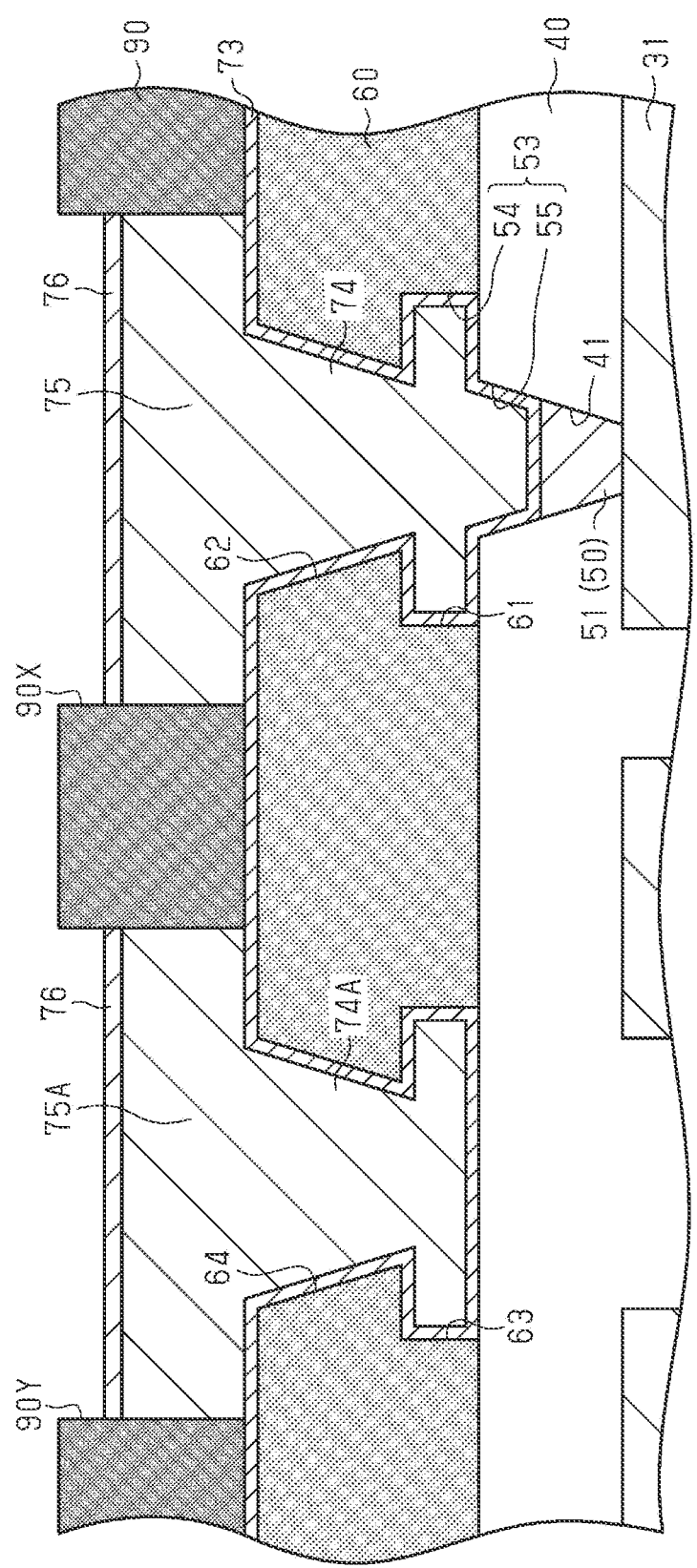

In the step illustrated in FIG. 14, in the same manner as the step illustrated in FIG. 5B, the electrolytic plating process is performed using the resist layer 90 as a plating mask and the seed layer 73 as a plating power feeding layer. That is, the electrolytic plating process is performed on the upper surface of the seed layer 73 exposed from the opening patterns 90X and 90Y in the resist layer 90. This step forms the metal layer 74 on the seed layer 73 in the opening 62 and the recesses 61 and 55. Further, the metal post 75 is formed integrally with the metal layer 74 on the seed layer 73 formed on the upper surface of the solder resist layer 60 in the opening pattern 90X. Also, the metal layer 74A is formed on the seed layer 73 in the opening 64 and the recess 63. Further, the metal post 75A is formed integrally with the metal layer 74A on the seed layer 73 formed on the upper surface of the solder resist layer 60 in the opening pattern 90Y. Subsequently, when appropriate, the surface-processed layer 76 is formed on the upper surfaces of the metal posts 75 and 75A.

In the same manner as the steps illustrated in FIGS. 6A and 6B, the resist layer 90 is removed by an alkaline stripping solution, and an unwanted portion of the seed layer 73 is removed by etching. As a result, as illustrated in FIG. 10, the via wiring 71 including the seed layer 73 and the metal layer 74 is formed in the opening 62 and the recesses 61 and 55 and the wiring pattern 72 including the seed layer 73 and the metal post 75 is formed on the upper surface of the solder resist layer 60. Also, the the via wiring 71A including the seed layer 73A and the metal layer 74A is formed in the opening 64 and the recess 63 and the wiring pattern 72A including the seed layer 73A and the metal post 75A is formed on the upper surface of the solder resist layer 60. The manufacturing steps described above manufacture the wiring substrate 10A.

In the embodiment, the seed layer 73 is formed through an electroless plating process (for example, electroless copper plating process). Instead, for example, the seed layer 73 may be formed by sputtering or vapor deposition.

In the embodiment, the seed layer 73 has a single-layer structure. However, the seed layer 73 may have a multilayer structure (e.g., two-layer structure). For example, the seed layer 73 may have a lamination structure (two-layer structure) including a titanium (Ti) layer and a Cu layer.

In the embodiment, the wiring layer 70 includes the seed layer 73 formed by an electroless plating metal layer and the metal layer 74 and the metal post 75 formed by an electrolytic plating metal layer. However, the structure of the wiring layer 70 is not particularly limited. For example, the wiring layer 70 may be formed by a solder bump. For example, a solder ball may be mounted on the wiring layer 50 (the via wiring 51) exposed through the opening 62, the through hole 54, and the recess 55, and the solder ball may be melted to form a solder bump. Alternatively, a solder plating process may be used to form a solder bump on the wiring layer 50 exposed through the opening 62, the through hole 54, and the recess 55. In this case, for example, in the step illustrated in FIG. 5B, a solder plating process that uses the seed layer 73 as a plating power feeding layer is performed to form the wiring layer 70 as a solder bump.

In the embodiment and the modified examples, the surface-processed layer 25 may be omitted from the wiring substrates 10 and 10A.

In the embodiment and the modified examples, the surface-processed layer 76 may be omitted from the wiring substrates 10 and 10A.

In the embodiment and the modified examples, the solder resist layer 60 is illustrated as an example of the outermost insulation layer (protective insulation layer) of the wiring substrates 10 and 10A. The protective insulation layer may be formed from various types of photosensitive insulative resins.

In the embodiment and the modified examples, the insulation layer 40 (first insulation layer) and the solder resist layer 60 (second insulation layer), which is formed on the upper surface of the insulation layer 40, have different thermal expansion coefficients. The first insulation layer and the second insulation layer may have the same thermal expansion coefficient.

In the embodiment and the modified examples, the wiring layer 70 is the outermost wiring layer and used as the connection terminal connected to the semiconductor element 81. However, the usage of the wiring layer 70 and the position of the wiring layer 70 in the wiring substrates 10 and 10A are not particularly limited. For example, the wiring layer 70 may be disposed as an intermediate wiring layer that is located in an intermediate position in the lamination direction of the wiring substrates 10 and 10A. For example, the wiring substrates 10 and 10A may further include an insulation layer covering the wiring layer 70 and a wiring layer formed on the upper surface of the insulation layer and electrically connected to the wiring layer 70.

In the embodiment, the underfill resin 85 may be omitted from the semiconductor device 80.

In the embodiment, the external connection terminals 86 may be omitted from the semiconductor device 80.

In the semiconductor device 80 of the embodiment, instead of the semiconductor element 81, other electronic components, for example, a crystal oscillator and a chip component such as a chip capacitor, a chip resistor, or a chip inductor may be mounted on the wiring substrate 10 (or the wiring substrate 10A). That is, an electronic component other than the semiconductor element 81 may be mounted on the wiring substrate 10 (or the wiring substrate 10A).

In the embodiment and the modified examples, the wiring substrate 10 may be embodied in a wiring substrate for a package such as a chip size package (CSP) or a small outline non-lead package (SON).

Clause

This disclosure further encompasses the following clause.

1. A method for manufacturing a wiring substrate, the method including:
   forming a first insulation layer;
   forming a first through hole extending through the first insulation layer in a thickness-wise direction;
   forming a first via wiring filling the first through hole;
   forming a second wiring pattern integrally with the first via wiring on an upper surface of the first insulation layer;
   forming a second insulation layer that covers the second wiring pattern on the upper surface of the first insulation layer;
   forming an opening that extends through the second insulation layer in the thickness-wise direction and exposes a portion of an upper surface of the second wiring pattern;
   forming a second through hole extending in the thickness-wise direction through the second wiring pattern exposed from the opening;
   forming a second recess in an upper surface of the first via wiring so that the second recess is connected to the second through hole;
   forming a second via wiring filling the second recess, the second through hole, and the opening; and
   forming a first wiring pattern integrally with the second via wiring on an upper surface of the second insulation layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A wiring substrate, comprising:
   a first insulation layer;
   a first through hole extending through the first insulation layer in a thickness-wise direction;
   a first via wiring formed in the first through hole;
   a second insulation layer formed on an upper surface of the first insulation layer;
   a first recess formed in a lower surface of the second insulation layer and connected to the first through hole;
   an opening formed in an upper surface of the second insulation layer and connected to the first recess;
   a second recess formed in an upper surface of the first via wiring and connected to the first recess;
   a second via wiring formed in the opening, the first recess, and the second recess;
   a first wiring pattern formed on the upper surface of the second insulation layer and electrically connected to the first via wiring by the second via wiring;
   a second wiring pattern formed in the first recess and electrically connected to the first via wiring; and
   a second through hole extending through the second wiring pattern in the thickness-wise direction and connected to the opening and the second recess,
   wherein the second via wiring fills the opening, the second through hole, and the second recess.

2. The wiring substrate according to claim 1, wherein the second insulation layer and the first insulation layer differ from each other in thermal expansion coefficient, and an interface between the first via wiring and a lower end surface of the second via wiring is located at a lower position than an interface between the first insulation layer and the second insulation layer.

3. The wiring substrate according to claim 1, wherein an upper end of the second through hole has a larger opening width than a lower end of the opening.

4. The wiring substrate according to claim 3, wherein a lower end of the second through hole has a larger opening width than an upper end of the first through hole.

5. The wiring substrate according to claim 3, wherein a lower end of the second through hole has a smaller opening width than an upper end of the first through hole, and a wall surface of the second recess is continuous with a wall surface of the second through hole.

6. The wiring substrate according claim 1, wherein the second via wiring includes
   an upper via part formed in the opening and extending from a position of the upper surface of the second insulation layer to an intermediate position of the second insulation layer,
   an intermediate via part integrated with the upper via part and formed in at least a portion of the first recess and extending from the intermediate position of the second insulation layer to a position of a lower surface of the second insulation layer, the intermediate via part including an anchor extending sideward from a lower end of the upper via part to an inner side of the second insulation layer, and
   a lower via part integrated with the intermediate via part and formed in the second recess and extending downward from a position of the upper surface of the first insulation layer, the lower via part being in contact with the upper surface of the first via wiring.

7. The wiring substrate according to claim 6, wherein the upper via part, the intermediate via part, and the lower via part are integrated to be generally cross-shaped in a cross-sectional view.

8. The wiring substrate according to claim 6, wherein the upper via part, the intermediate via part, and the lower via part are integrated to be generally inverted-T-shaped in a cross-sectional view.

9. A wiring substrate, comprising:
   a first insulation layer;

a first through hole extending through the first insulation layer in a thickness-wise direction;

a first via wiring formed in the first through hole;

a second insulation layer formed on an upper surface of the first insulation layer;

a first recess formed in a lower surface of the second insulation layer and connected to the first through hole;

an opening formed in an upper surface of the second insulation layer and connected to the first recess;

a second recess formed in an upper surface of the first via wiring and connected to the first recess;

a second via wiring formed in the opening, the first recess, and the second recess; and a first wiring pattern formed on the upper surface of the second insulation layer and electrically connected to the first via wiring by the second via wiring, wherein the second insulation layer and the first insulation layer differ from each other in thermal expansion coefficient, and an interface between the first via wiring and a lower end surface of the second via wiring is located at a lower position than an interface between the first insulation layer and the second insulation layer.

10. A semiconductor device, comprising:

the wiring substrate according to claim 1; and a semiconductor element mounted on the wiring substrate, wherein the second insulation layer includes a solder resist layer, the first wiring pattern includes a rod-shaped connection terminal extending upward from an upper surface of the solder resist layer, and the semiconductor element is connected to the first wiring pattern.

* * * * *